US010829849B2

(12) United States Patent
Rozak et al.

(10) Patent No.: US 10,829,849 B2
(45) Date of Patent: *Nov. 10, 2020

(54) MOLYBDENUM CONTAINING TARGETS

(71) Applicant: H.C. STARCK, INC., Newton, MA (US)

(72) Inventors: Gary Alan Rozak, Akron, OH (US); Mark E. Gaydos, Nashua, NH (US); Patrick Alan Hogan, Somerville, MA (US); Shuwei Sun, Framingham, MA (US)

(73) Assignee: H.C. STARCK, INC., Newton, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/908,896

(22) Filed: Mar. 1, 2018

(65) Prior Publication Data
US 2018/0187297 A1     Jul. 5, 2018

Related U.S. Application Data

(63) Continuation of application No. 14/669,258, filed on Mar. 26, 2015, now Pat. No. 9,945,023, which is a
(Continued)

(51) Int. Cl.
| | |
|---|---|
| *C23C 14/18* | (2006.01) |
| *C22C 1/04* | (2006.01) |
| *C22C 27/04* | (2006.01) |
| *C23C 14/34* | (2006.01) |
| *C23C 14/58* | (2006.01) |
| *G06F 3/041* | (2006.01) |

(52) U.S. Cl.
CPC ............ *C23C 14/185* (2013.01); *C22C 1/045* (2013.01); *C22C 27/04* (2013.01); *C23C 14/3407* (2013.01); *C23C 14/3414* (2013.01); *C23C 14/5873* (2013.01); *G06F 3/041* (2013.01); *B22F 2998/10* (2013.01); *G06F 2203/04103* (2013.01); *Y10T 428/12743* (2015.01); *Y10T 428/12826* (2015.01); *Y10T 428/265* (2015.01); *Y10T 428/31678* (2015.04)

(58) Field of Classification Search
CPC ..................................................... C22C 27/04
See application file for complete search history.

(56) References Cited

U.S. PATENT DOCUMENTS 2,678,269 A * 5/1954 Ham .................. C22C 27/04
                                                    148/407
2,678,270 A * 5/1954 Ham .................. C22C 27/04
                                                    148/407
(Continued)

*Primary Examiner* — Hoa (Holly) Le
(74) *Attorney, Agent, or Firm* — Morgan, Lewis & Bockius LLP

(57) ABSTRACT

The invention is directed at sputter targets including 50 atomic % or more molybdenum, a second metal element of niobium or vanadium, and a third metal element selected from the group consisting of titanium, chromium, niobium, vanadium, and tantalum, wherein the third metal element is different from the second metal element, and deposited films prepared by the sputter targets. In a preferred aspect of the invention, the sputter target includes a phase that is rich in molybdenum, a phase that is rich in the second metal element, and a phase that is rich in the third metal element.

24 Claims, 12 Drawing Sheets

Mn-Nb-Ta deposited film. (grain size is About 49 nm)

Related U.S. Application Data continuation of application No. 13/856,617, filed on Apr. 4, 2013, now Pat. No. 9,017,762, which is a continuation of application No. 12/827,550, filed on Jun. 30, 2010, now Pat. No. 8,449,817.

(56) References Cited

U.S. PATENT DOCUMENTS

| | | | | |
|---|---|---|---|---|
| 5,595,616 | A | * 1/1997 | Berczik | C22C 32/0047 148/538 |
| 8,449,817 | B2 | * 5/2013 | Rozak | C22C 27/04 420/429 |
| 8,449,818 | B2 | * 5/2013 | Rozak | C22C 1/045 420/429 |
| 2007/0089984 | A1 | * 4/2007 | Gaydos | B22F 3/15 204/298.12 |

* cited by examiner

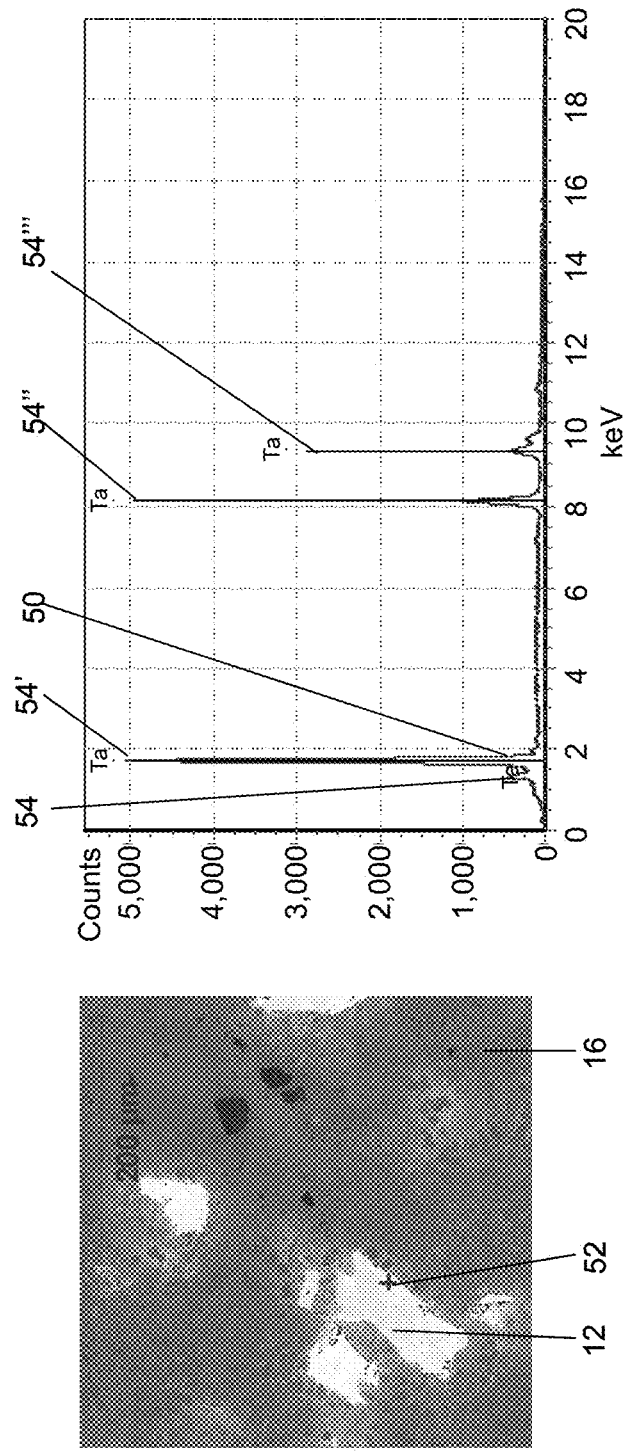

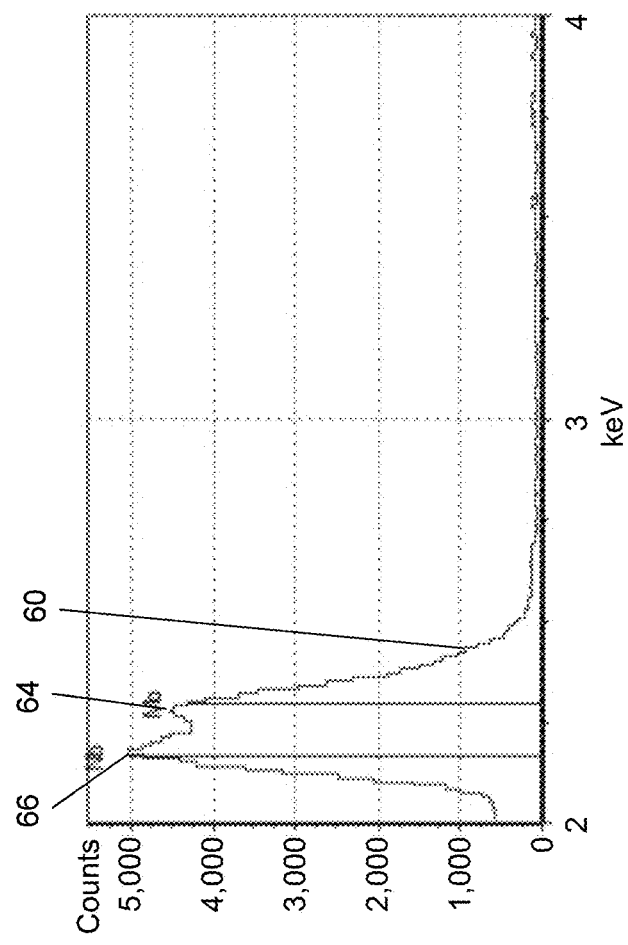
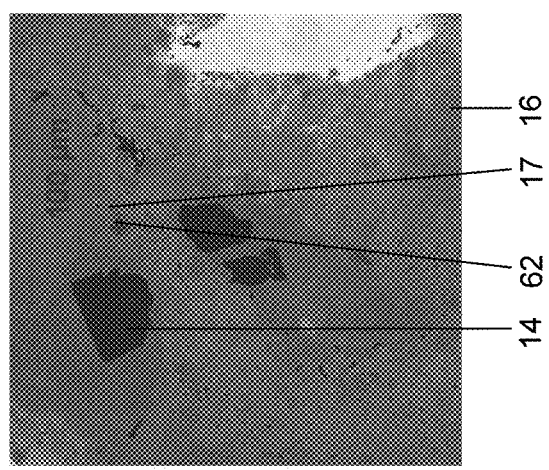
FIG. 6B
FIG. 6A

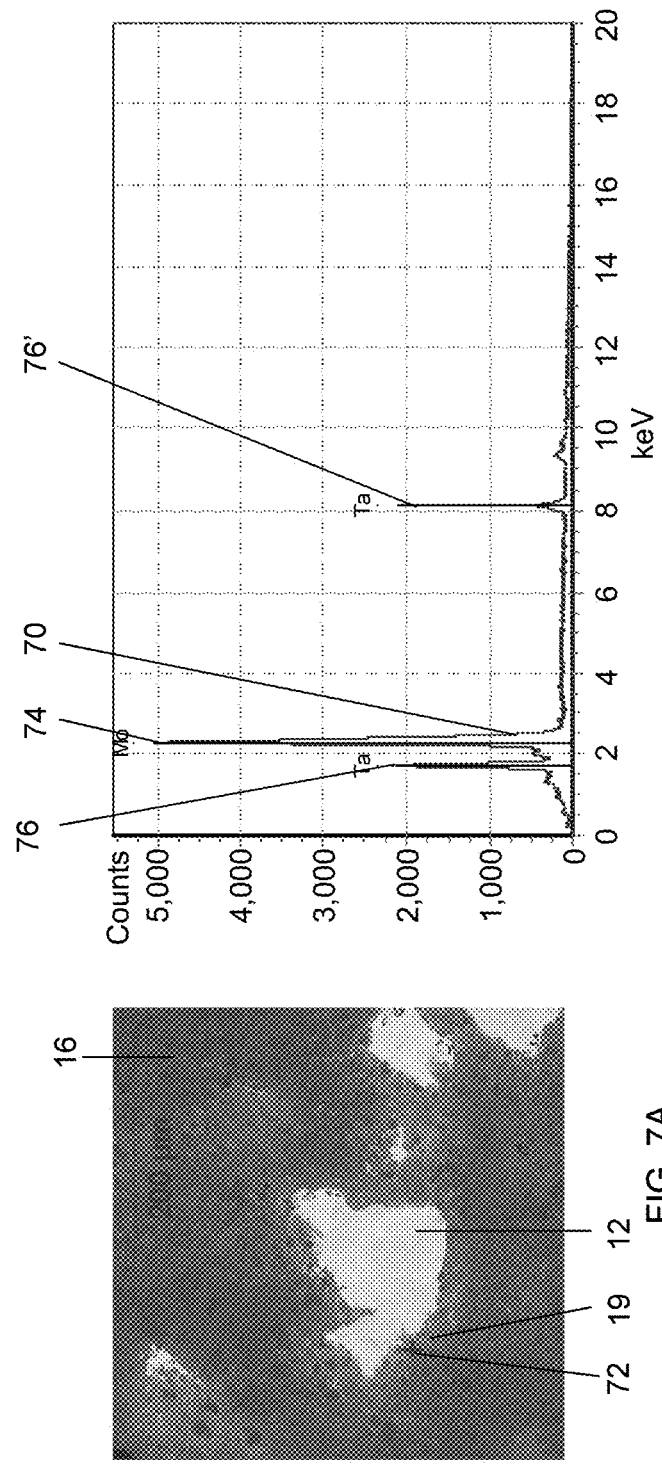

Mn-Nb-Ta deposited film.
(grain size is About 49 nm)

Mn-Nb-Ta deposited film.
(grain size is About 62 nm)

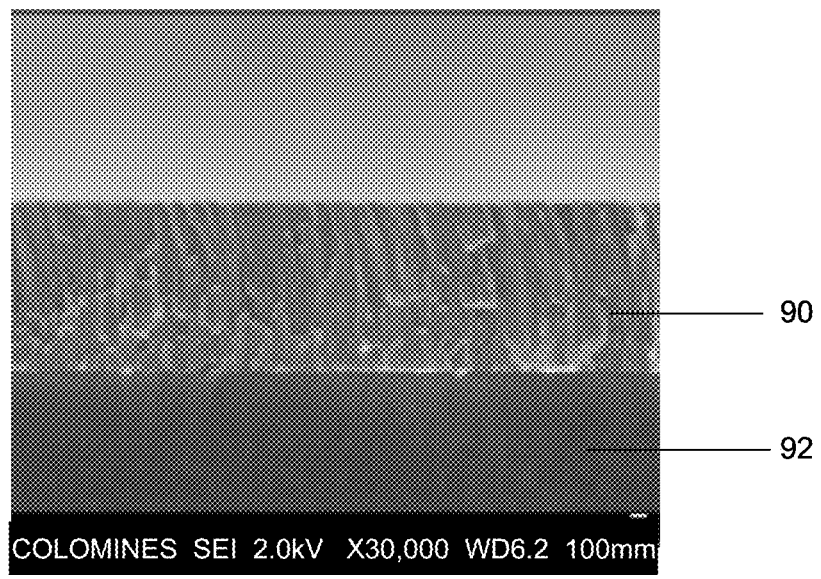
FIG. 9. Mo-Nb-Ta cross-section of deposited film illustrating columnar structure.

MOLYBDENUM CONTAINING TARGETS

RELATED APPLICATIONS

This application is a continuation of U.S. patent application Ser. No. 14/669,258, filed Mar. 26, 2015, now U.S. Pat. No. 9,945,023, which is a continuation of U.S. patent application Ser. No. 13/856,617, filed Apr. 4, 2013, now U.S. Pat. No. 9,017,762 which is a continuation of U.S. patent application Ser. No. 12/827,550, filed Jun. 30, 2010, now U.S. Pat. No. 8,449,817 the entire disclosure of each of which is hereby incorporated herein by reference.

FIELD OF THE INVENTION

The present invention relates generally to sputter targets, methods for preparing sputter targets, methods of using the sputter targets in preparing thin molybdenum containing films, such as those used to make flat display panels (e.g., thin film transistor-liquid crystal displays) and photovoltaic cells, thin films made by the targets, and products incorporating the same.

BACKGROUND

Sputter deposition is a technique used to produce a metallic layer in various manufacturing processes used in the semiconductor and the photoelectric industries. With advances in the semiconductor and photoelectric industries, there are needs for sputter targets that meet one or more electrical requirements, durability requirements, and processability requirements. For example, there is a need for sputter targets that that are easier to process, that are less expensive, and that can be used to produce more uniform films. Furthermore, as the size of displays increases, the economic benefits of even modest improvements in performance becomes amplified. Slight variations in compositions of a sputter target could possibly lead to significant property changes. Moreover, different manners in which a target is made may lead to varied properties resulting from a target made using the same composition.

Sputter targets made from a metal such as molybdenum, methods for preparing them, and their use in flat panel displays are described in U.S. Pat. No. 7,336,336B2, and in U.S. Patent Application Publication No. 2005/0189401A1 by Butzer et al, published on Sep. 1, 2005, each of which is incorporated herein by reference in its entirety.

Sputter targets containing molybdenum and titanium, methods for preparing them, and their use in flat panel displays are described in U.S. Pat. No. 7,336,824B2 and in U.S. Patent Application Publication Nos. 2008/0314737A1 by Gaydos et al. published on Dec. 25, 2008, 2007/0089984A1 by Gaydos et al., published on Apr. 26, 2007, and 2007/0251820A1 by Nitta et al. published on Nov. 1, 2007, each of which is incorporated herein by reference in its entirety.

Sputter targets containing molybdenum and a second metal are described in U.S. Patent Application Publication No. 2004/0263055A1 by Chao et al. published on Dec. 30, 2004, 2007/0122649A1 by Lee et al. published on May 31, 2007, and 2005/0230244A1 by Inoue et al. published on Oct. 20, 2005, 2008/0073674A1 by Cho et al. published on Mar. 27, 2008, and 2005/0191202A1 by Iwasaki et al. published on Sep. 1, 2005, each of which is incorporated herein by reference in its entirety. In the manufacture of many devices, thin film products are often built up layer by layer with one or more material removal steps (e.g., etching) to remove one or more layers. To accommodate a wide selection of materials for enhancing design choice, it is attractive to be able to selectively control thin film etch rate (i.e., the rate of removal of material by etching). For example, it is attractive to be able to achieve certain etch rates by selection of an appropriate sputter target. It may be desirable for a layer deposited from a sputter target to have an etch rate that is compatible with the etch rate of one or more other layers (e.g., etch rates that are the same or differ by less than about 25%) and/or to have an etch rate that is different (e.g., by about 25% or more) from the etch rate of one or more other layers.

For example, for some applications there continues to exist a need for sputter targets that produce deposited layers having relatively high etch rates, such as etch rates in ferricyanide solution greater than the etch rate of a layer deposited from a sputter target consisting of 50 atomic % molybdenum and 50 atomic % titanium. There is also a need for sputter targets for producing deposited layers having one or any combination of a strong adhesion to substrates, a good barrier properties, an ability to reduce or prevent the formation of copper silicon compounds (such as copper silicide) when placed between Si-containing and Cu-containing layers, or a relatively low electrical resistivity (e.g., about 60 μΩ·cm or less). Additionally, there is a need for sputter targets having one or more of the above properties, that is prepared from a heterogeneous material that can be processed into a sputter target using a step of rolling.

SUMMARY OF THE INVENTION

One or more of the above needs may be surprisingly met with a sputter target including molybdenum (Mo), a second metal element selected from the group consisting of niobium (Nb) and vanadium (V) and a third metal element selected from the group consisting of titanium, vanadium, niobium, chromium, and tantalum, wherein the third metal element is different from the second metal element. The present invention in its various teachings thus pertain to such compositions and sputter targets made with them, as well as resulting thin film products, and associated methods.

One aspect of the invention is a process for preparing a sputter target and/or a blank that is used to manufacture a sputter target that includes a step of blending a first powder containing about 50 atomic % or more of molybdenum, a second powder containing about 50 atomic % or more of a second metal element selected from the group consisting of niobium and vanadium, and a third powder containing about 50 atomic % or more of a third metal element selected from the group consisting of titanium, vanadium, niobium, chromium, and tantalum, wherein the third metal element is different from the second metal element.

Another aspect of the invention is directed at a sputter target and/or a blank that is used to manufacture a sputter target comprising: about 40 atomic % or more molybdenum, based on the total number of atoms in the sputter target; about 1 atomic % or more of a second metal element, based on the total number of atoms in the sputter target wherein the second metal element is selected from the group consisting of niobium and vanadium; and about 1 atomic % or more of a third metal element, based on the total number of atoms in the sputter target, wherein the third metal element is selected from the group consisting of tantalum, chromium, vanadium, niobium, and titanium, and the third metal element is different from the second metal element; so that the sputter target may be used for preparing a deposited film including an alloy, the alloy comprising molybdenum, the second metal element and the third metal element.

Another aspect of the invention is directed at a sputter target and/or a blank that is used to manufacture a sputter target including at least about 40% by volume, based on the total volume of the sputter target, of a first phase, wherein the first phase includes at least about 50 atomic % of a first metal element (and thus may be said to be rich in the first metal element), wherein the first metal element is molybdenum; from about 1 to about 40% by volume, based on the total volume of the sputter target, of a second phase, wherein the second phase includes at least about 50 atomic % of a second metal element (and thus may be said to be rich in the second metal element), wherein the second metal element is niobium or vanadium, and from about 1 to about 40% by volume, based on the total volume of the sputter target, of a third phase, wherein the third phase includes at least about 50 atomic % of a third metal element (and thus may be said to be rich in the third metal element), wherein the third metal element is selected from the group consisting of titanium, vanadium, niobium, chromium, and tantalum, wherein the third metal element is different from the second metal element, so that the sputter target may be used for preparing a deposited film including an alloy, the alloy comprising molybdenum, the second metal element and the third metal element. It will be appreciated that in the teachings herein, the second metal element may be replaced by a combination of vanadium and niobium. It will also be appreciated that in the teachings herein, the third metal element may be replaced by a combination of two or more metal elements selected from the group consisting of titanium, vanadium, niobium, chromium, and tantalum, with the proviso, that the combination is different from the second metal element.

Another aspect of the invention is directed at a film (e.g., a sputter-deposited film) including about 50 atomic % or more molybdenum, about 0.5 atomic % or more of a second metal element selected from the group consisting of niobium and vanadium, and about 0.5 atomic % or more of a third element selected from the group consisting of titanium, vanadium, niobium, chromium, and tantalum, wherein the third metal element is different from the second metal element. By way of example, one such film may have about 50 atomic % to about 90 atomic % molybdenum, about 5 atomic % to about 30 atomic % of the second metal element (e.g., niobium or vanadium), and about 5 atomic % to about 30 atomic % of the third metal element. The film may exhibit a relatively high etch rate in accordance with the etch rate teachings herein.

Another aspect of the invention is directed at a multilayer structure including a film deposited from a sputter target described herein.

Another aspect of the invention is directed at a process for depositing a film on a substrate using a sputter target described herein.

The sputter targets of the present invention may advantageously be used to deposit a film having generally high etch rates. For example, the etch rate of the deposited film in ferricyanide solution at 25° C. may be about 100 nm/min or more, preferably about 150 nm/min or more, more preferably about 200 nm/min or more, even more preferably about 225 nm/min or more, even more preferably about 300 nm/min or more, and most preferably about 400 nm/min or more. The sputter target may be used to deposit a film having the following characteristics: a strong adhesion to substrates; good barrier properties; that substantially avoids the formation of copper silicide when placed between a silicon-containing layer and a copper-containing layer; low electrical resistivity; or any combination thereof. Advantageously, the sputter target may be formed of a material capable of being deformed, such as by one or more thermomechanical deformation operations. For example the sputter target may be prepared from a material capable of being rolled (e.g., through one or more rolling operations), preferably without cracking, so that large sputter targets can be produced efficiently. It is also possible to make large targets by joining multiple individually preformed structures (e.g., blocks), e.g., by diffusion bonding via a hot isostatic processing operation, with or without powder between adjoining preformed structures.

BRIEF DESCRIPTION OF THE DRAWINGS

As illustrated in FIG. 3A, the sputter target preferably includes a molybdenum rich phase.

As illustrated in FIG. 3B, the sputter target may include a phase that is essentially entirely (e.g., about 90 atomic % or more, preferably about 95 atomic % or more, and more preferably about 98 atomic % or more) molybdenum.

As illustrated in FIG. 4A, the sputter target preferably includes a niobium rich phase.

FIG. 4B illustrates that the sputter target may have a phase that is essentially entirely (e.g., about 90 atomic % or more, preferably about 95 atomic % or more, and more preferably about 98 atomic % or more) niobium.

FIG. 5A is an illustrative scanning electron micrograph of a sputter target including molybdenum, niobium, and tantalum using backscattered electron imaging. As illustrated in FIG. 5A, the sputter target preferably includes a tantalum rich phase.

FIG. 5B is an illustrative energy dispersive x-ray spectroscopy graph showing the frequency distribution of x-rays having energy from 0 to 20 keV energy for a region of the sputter target of FIG. 5A. FIG. 5B illustrates that the sputter target may have a phase that is essentially entirely (e.g., about 90 atomic % or more, preferably about 95 atomic % or more, and more preferably about 98 atomic % or more) tantalum.

FIG. 6A is an illustrative scanning electron micrograph of a sputter target including molybdenum, niobium, and tantalum using backscattered electron imaging. As illustrated in FIG. 6A, the sputter target may optionally includes a phase that consists essentially of or even entirely of an alloy of niobium and molybdenum, e.g., one that includes about 10 atomic % or more niobium and about 10 atomic % or more molybdenum. For example, the total concentration of niobium and molybdenum in the alloy may be about 80 atomic % or more, preferably about 90 atomic % or more, preferably about 95 atomic % or more, and more preferably about 98 atomic % or more.

FIG. 6B is an illustrative energy dispersive x-ray spectroscopy graph showing the frequency distribution of x-rays having energy from 0 to 4 keV energy for a region of the sputter target of FIG. 6A. FIG. 6B illustrates that the sputter target may have a phase that includes molybdenum and niobium.

FIG. 7A is an illustrative scanning electron micrograph of a sputter target including molybdenum, niobium, and tantalum using backscattered electron imaging. As illustrated in FIG. 7A, the sputter target may optionally includes a phase that consists essentially of or even entirely of an alloy of tantalum and molybdenum, e.g., one that includes about 10 atomic % or more tantalum and about 10 atomic % or more molybdenum. For example, the total concentration of tantalum and molybdenum in the alloy may be about 80 atomic % or more, preferably about 90 atomic % or more, more preferably about 95 atomic % or more, and most preferably about 98 atomic % or more.

FIG. 7B is an illustrative energy dispersive x-ray spectroscopy graph showing the frequency distribution of x-rays having energy from 0 to 20 keV energy for a region of the sputter target of FIG. 7A. FIG. 7B illustrates that the sputter target may have a phase that includes molybdenum and tantalum.

FIGS. 8A and 88B are illustrative scanning electron micrographs of a surface of sputtered films deposited on a substrate using secondary electron imaging. The films are sputtered from a sputter target including a molybdenum rich phase, a niobium rich phase, and a tantalum rich phase. The deposited film preferably include an alloy phase containing molybdenum, niobium and tantalum.

FIG. 9 is an illustrative scanning electron micrograph of a cross-section of a sputtered film deposited on a substrate. The film is sputtered from a sputter target including a molybdenum rich phase, a niobium rich phase, and a tantalum rich phase. The deposited film preferably includes an alloy phase containing molybdenum, niobium and tantalum. The deposited film may have a columnar morphology, such as the morphology illustrated in FIG. 9.

FIG. 10C is an illustrative overlay of the concentrations profiles before and after annealing in the region of the interfaces between the layers.

DETAILED DESCRIPTION

Figure 1:
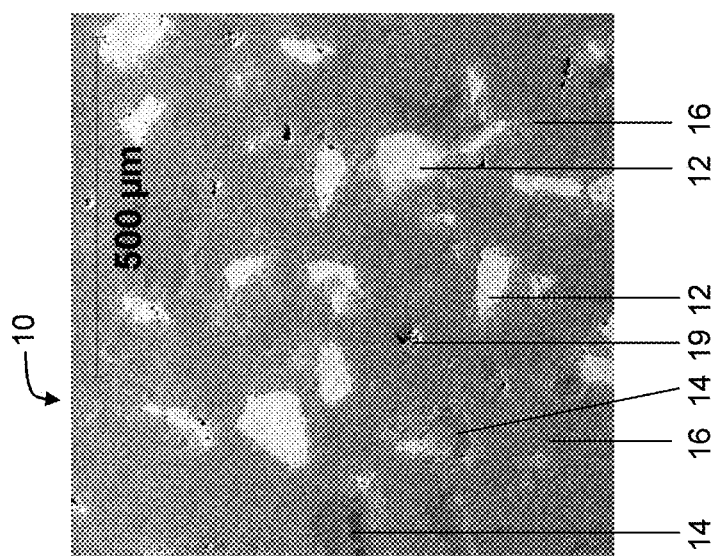
FIG. 1 is an illustrative scanning electron micrograph of a sputter target including molybdenum, niobium, and tantalum using secondary electron imaging. The sputter target preferably includes a molybdenum rich phase that includes 50 atomic % or more molybdenum, a niobium rich phase that includes 50 atomic % or more niobium, and a tantalum rich phase that includes 50 atomic % or more tantalum.

The present invention, in its various aspects, makes use of a unique combination of materials to derive an attractive sputter target for use in the manufacture of one or more various devices (e.g., flat panel displays) that include a thin film layer, such as a thin film barrier layer, tie layer, or otherwise. The deposited layers prepared from the sputter targets of the present invention have a surprising combination of relatively low electrical resistivity, good adhesion to substrates and/or excellent barrier properties. As taught herein, the sputter target may be tailored to provide a relatively high etch rate (e.g., in ferricyanide solution).

The sputter targets of the present invention employ three or more different elements to achieve the desired performance properties. Without limitation, suitable sputter targets include material including or consisting essentially of three metal elements, four metal elements, or five or more metal elements. For example, the sputter target may include or consist substantially of molybdenum (i.e. Mo) and two or more additional elements (such as two, three or more elements) selected from the group consisting of titanium (i.e., Ti), vanadium (i.e., V), chromium (i.e., Cr), tantalum (i.e., Ta), and niobium (i.e., Nb), wherein at least one of the additional elements is niobium or vanadium. Preferred sputter targets include Mo, Ti, V, Cr, Ta, and Nb, present at a total concentration of about 60 atomic % or more, more preferably about 80 atomic % or more, even more preferably about 95 atomic % or more, even more preferably about 99 atomic % or more, and most preferably about 99.5 atomic % or more, based on the total number of atoms in the sputter target. Without limitation, deposited layers prepared from the sputter targets of the present invention may include ternary materials and/or quaternary materials.

The sputter targets may be used to produce (e.g., to deposit) a film having at least one molybdenum containing layer (e.g., a barrier layer) that comprises molybdenum (e.g., at a concentration of at least 50 atomic % based on the total number of atoms in the molybdenum containing layer), a second metal element, and a third metal element. The deposited layer may contain fewer phases than the sputter target. Without limitation, exemplary deposited layers produced from the sputter target may contain one or two phases, whereas the sputter target from which they are prepared, preferably contain at least three phases (e.g., one or more pure metal phases and/or one or more alloy phases). More preferably, the deposited layer includes or consists essentially of an alloy phase, wherein the alloy includes molybdenum, the second metal element and the third metal element. Even more preferably, the deposited layer includes or consist substantially of an alloy phase, wherein the alloy includes molybdenum, the niobium and the third metal element. Most preferably, the deposited layer includes or consist substantially of an alloy phase, wherein the alloy includes molybdenum, the niobium and tantalum.

Morphology of the Sputter Target

The sputter target may be a heterogeneous material including a plurality of phases. The sputter target preferably comprises at least three phases. For example, the target may include, including one or more first phases each comprising about 50 atomic % or more molybdenum, one or more second phases each comprising about 50 atomic % or more of a second metal element different from molybdenum, and one or more third phases each comprising at about 50 atomic % or more of a third metal element different from molybdenum and second metal elements. The second metal element preferably is selected from the group consisting of niobium and vanadium. Most preferably, the second metal element is niobium. The third metal element is preferably selected from the group consisting of titanium, chromium, vanadium, niobium, and tantalum. Most preferably, the third metal element is tantalum.

A second phase may differ from a first phase in one or any combination of the following: the concentration of one, two or more elements, density, electrical resistivity, the bravais lattice structure, the symmetry group, one or more lattice dimensions, or the crystallographic space group. By way of example, a first phase and a second phase may differ in the concentration of one element by about 0.5 wt. % or more, by about 1 wt. % or more, by about 5 wt. % or more, or by about 20 wt. % or more. A third phase may differ from a first phase and/or a second phase in one or any combination of the following: the concentration of one, two or more elements, density, electrical resistivity, the bravais lattice structure, the symmetry group, one or more lattice dimensions, or the crystallographic space group. By way of example, the concentration of an element in a third phase my differ from the concentration of the element in a first phase, in a second phase, or both, by about 0.5 wt. % or more, by about 1 wt. % or more, by about 5 wt. % or more, or by about 20 wt. % or more. The sputter target may include two phases (such as a first phase and a second phase or a third phase), wherein the difference between the densities of the two phases is about 0.1 g/cm$^3$ or more, preferably about 0.3 g/cm$^3$ or more, more preferably about 0.6 g/cm$^3$, and most preferably about 1.2 g/cm$^3$ or more.

The first phase, the second phase, and the third phase, may each independently include crystals characterized by one or more of the 14 bravais lattice types. The bravais lattice of a phase may be triclinic, monoclinic (e.g., simple monoclinic or centered monoclinic), orthorhombic (e.g., simple base centered orthorhombic, body centered orthorhombic, or face-centered orthorhombic), tetragonal (e.g., simple tetragonal or body-centered tetragonal), rhombohedral, hexagonal, or cubic (e.g., simple cubic, body-centered cubic or face-centered cubic). By way of example, the first phase, the second phase, and the third phase may each independently include or consist essentially of crystals having bravais lattices that are hexagonal, simple cubic, body-centered cubic, and face-centered cubic, or any combination thereof. The one or more second phases may include crystals having a bravais lattice that is the same or different from the bravais lattice of the one or more first phases. By way of example, the first phase may include a phase having a body-centered cubic bravais lattice, and the second phase may include a phase having a body-centered cubic bravais lattice, a hexagonal bravais lattice, or both. The one or more third phases may include crystals having a bravais lattice that is the same as or different from the one or more first phases, that is different from the one or more second phases, or any combination thereof. By way of example, the one or more third phases may include or consist essentially of crystals having a body-centered cubic bravais lattice, a hexagonal bravais lattice, or both.

It will be appreciated that the first phase of the sputter target may include one or more first phases each including about 50 atomic % or more molybdenum. By way of example, the first phase may include a phase of substantially pure molybdenum, an alloy phase including molybdenum and a minor amount (i.e, less than 50 atomic %) of the second metal element, an alloy phase including molybdenum and a minor amount of the third metal element, or any combination thereof. The second phase of the sputter target may include on or more phases each including about 50 atomic % or more of the second metal element. By way of example, the second phase may include a phase of substantially pure second metal element, an alloy phase including the second metal element and a minor amount of molybdenum, an alloy phase including the second metal element and a minor amount of the third metal element, or any combination thereof. The third phase of the sputter target may include on or more phases each including about 50 atomic % or more of the third metal element. By way of example, the third phase may include a phase of substantially pure third metal element, an alloy phase including the third metal element and a minor amount of molybdenum, an alloy phase including the third metal element and a minor amount of the second metal element, or any combination thereof.

The first phase, second phase, and third phase may each independently be discrete phases, or continuous phases. Preferably the first phase is a continuous phase. Without being bound by theory, it is believed that a first phase that is continuous may improve the capability of rolling a sputter target in order to increase its length, increase its width, or both. Preferably the second phase is a discrete phase, Preferably the third phase is a discrete phase. It will be appreciated that continuous phase refers to a phase that is co-continuous (i.e., there are a plurality of continuous phases) or to a continuous phase that is the sole continuous phase.

FIG. 1 is an illustrative scanning electron micrograph of a sputter target including molybdenum, niobium, and tantalum using secondary electron imaging. According to the teachings herein, other metal elements may be employed in the sputter target. With reference to FIG. 1, the sputter target 10 may include a first phase 16, a second phase 14, and a third phase 12. The first phase 16 of the sputter target 10 may be a continuous phase, include 50 atomic % or more molybdenum (e.g., about 75 atomic % or more molybdenum) or both. As illustrated in FIG. 1, the second phase 14, the third phase 12, or both, may be a discrete phase (such as a discrete phase dispersed in the first phase). A second phase, a third phase, or both that is a continuous phase (e.g., a co-continuous phase) is also within the scope of the invention. The second phase 14 may include about 50 atomic % or more of a second element, such as niobium or vanadium, based on the total number of atoms in the second phase. The third phase 12 may include about 50 atomic % or more of a third element, such as titanium, chromium, niobium, vanadium or tantalum, based on the total number of atoms in the third phase. As illustrated in FIG. 1, the volume of the one or more first phases may be about 40 volume % or more, or about 50 volume % or more, based on the total volume of the sputter target. The volume of the one or more second phases, the volume or the one or more third phases, and the total volume of the one or more first and second phases, may be about 1 volume % or more, or about 5 volume % or more, based on the total volume of the sputter target. The volume of the one or more second phases, the volume or the one or more third phases, and the total volume of the one or more first phases and second phases, may each be about 50 volume % or less, or about 25 volume % or less, based on the total volume of the sputter target. The second phase, the third phase, or both may be generally randomly oriented. The second phase, the third phase, or both may be generally elongated. Preferably the second phase, the third phase, or both, have a length to width ratio of about 20:1 or less, about 10:1 or less, or about 5:1 or less. The second phase may include particles having an average length of about 0.3 μm or more, having an average length of about 200 μm or less, or both. The third phase may include particles having an average length of about 0.3 µm or more, having an average length of about 200 µm or less, or both. The length and/or volume of a phase may be measured using scanning electron microscopy. Scanning electron microscopy may be supplemented by additional methods, such as energy dispersive x-ray spectroscopy, for measuring the composition of a phase.

Figure 2:
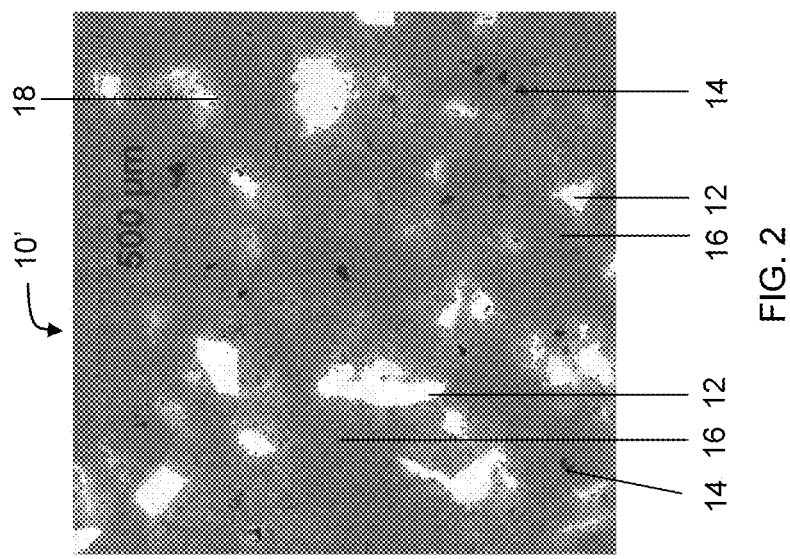
FIG. 2 is an illustrative scanning electron micrograph of a sputter target including molybdenum, niobium and tantalum using backscattered electron imaging. The sputter target preferably includes a molybdenum rich phase, a tantalum rich phase, and a niobium rich phase.

FIG. 2 is an illustrative scanning electron micrograph of a sputter target including molybdenum, niobium and tantalum using backscattered electron imaging. According to the teachings herein, other metal elements may be employed in the sputter target. With reference to FIG. 2, the sputter target 10 may include a first phase 16, a second phase 14, and a third phase 12. Each of the individual phases may be a substantially pure metallic phase (e.g., a phase that includes a metal in an amount of about 80 atomic % or more, about 90 atomic % or more, or about 95 atomic % or more). The sputter target may also include an alloy phase, such as an alloy phase including molybdenum and tantalum 18, and/or an intermetallic phase.

The one or more first phases may optionally include both a relatively pure first phase and a highly alloyed first phase containing the molybdenum at a lower concentration than the relatively pure first phase. For example, the relatively pure first phase may contain molybdenum at a concentration of about 80 atomic % or more, more preferably about 90 atomic %, or more, based on the total number of atoms in the relatively pure first phase. By way of example, the concentration of molybdenum in the highly alloyed first phase may be about 90 atomic % or less, about 80 atomic % or less, or about 70 atomic % or less. Preferably, the one or more first phases includes a sufficient volume of material having a generally high molybdenum concentration (e.g., about 60 atomic % or more molybdenum, about 70 atomic % or more molybdenum, about 80 atomic % or more molybdenum, or about 90 atomic % or more molybdenum) so that the sputter target can be rolled in a step that increases the width, the length, or both, of the sputter target.

The one or more second phases may optionally include both a relatively pure second phase (e.g., a phase containing about 80 atomic % or more, more preferably about 90 or more atomic % of the second metal element based on the total number of atoms in the relatively pure second phase) and a highly alloyed second phase containing the second metal element at a lower concentration (e.g., at a concentration about 90 atomic % or less, or about 80 atomic % or less) than the relatively pure second phase. The one or more third phases may optionally include both a relatively pure third phase (e.g., a phase containing about 80 atomic % or more, more preferably about 90 atomic % or more of the third metal element based on the total number of atoms in the relatively pure third phase) and a highly alloyed third phase containing the third metal element at a lower concentration (e.g., at a concentration about 90 atomic % or less, or about 80 atomic % or less) than in the relatively pure third phase.

The volume of the one or more first phases preferably is sufficiently high so that the first phase is a continuous phase (e.g., a matrix phase in which one or more other phases is dispersed). The volume of the one or more first phases may be about 40% or more by volume, about 50% or more by volume, about 60% or more by volume, or about 70% or more by volume, based on the total volume of the sputter target. Preferably the volume of the one or more first phases is greater than the volume of the one or more second phase. Preferably the volume of the one or more first phases is greater than the volume of the one or more second phases.

The volume of the one or more first phases may be about 99% or less by volume, about 95% or less by volume, about 92% or less by volume, or about 90% or less by volume, based on the total volume of the sputter target.

The volume of the one or more second phases, the one or more third phases, or the combination of the one or more second phases and the one or more third phases may be about 1% or more by volume, about 2% or more by volume, about 3% or more by volume, or about 5% or more by volume, based on the total volume of the sputter target. The volume of the one or more second phases, the one or more third phases, or the combination of the one or more second phases and the one or more third phases may be about 50% or less by volume, about 45% or less by volume, about 40% or less by volume, about 35% or less by volume, about 30% or less by volume, about 25% or less by volume, or about 20% or less by volume, based on the total volume of the sputter target.

The one or more first phases, the one or more second phases, and the one or more third phases of the sputter target may each individually be discrete phases, continuous phases, or co-continuous phases. For example, the sputter target may include a first phase that is a continuous phase. Preferably, the one or more second phases includes a discrete phases. For example a discrete second phase may be a discrete phase within a first phase, or a discrete phase within the third phase. More, preferably, the sputter target includes a second phase including 50 atomic % or more niobium or vanadium that is a discrete phase within a first phase including 50 atomic % or more molybdenum. Preferably, the one or more third phases includes a discrete phase. For example a discrete third phase my be a discrete phase within the first phase, or a discrete phase within the second phase. More preferably, the sputter target includes a third phase including 50 atomic % or more of titanium, chromium, niobium, vanadium, or tantalum that is a discrete phase within a first phase including 50 atomic % or more molybdenum. If the sputter target has at least two second phases, it may have a morphology in which one of the second phases contains about 80 atomic % or more of the second metal element and is encapsulated by another of the second phases that contains a lower concentration of the second metal element. If the sputter target has at least two third phases, it may have a morphology in which one of the third phases contains about 80 atomic % or more of the third metal element and is encapsulated by another of the third phases that contains a lower concentration of the third metal element.

The size of the domains (i.e., a contiguous region that may include one or more grains of a phase) of one or more, or even all of the phases of the sputter target may be relatively large. For example, the size of the domains of the one or more, or even all of the phases of the sputter target may be larger (e.g., by 50% or more, by about 100% or more, by about 200% or more, by about 500% or more, or by about 1000% or more) than the size of the domains of the phase or phases of a deposited layer prepared from the sputter target. Without limitation the domain size (e.g., the number average length of the domains) of the one or more first phases, the one or more second phases, and/or the one or more third phases, may be about 0.3 µm or more, preferably about 0.5 µm or more, more preferably about 1 µm or more, and most preferably greater 3 µm or more. In determining the domain sizes of the phases of the sputter target, all of the first phases may be considered as one phase, all of the second phases may be considered as one phase, and all of the third phases may be considered as one phase. Without limitation the domain size (e.g., the number average length of the domains) of the one or more first phases, of the one or more second phases, and/or the one or more third phases, may be about 200 μm or less, preferably about 100 μm or less, and more preferably about 50 μm or less. It will be appreciated that larger domain sizes may be employed in the sputter target. For example, as taught herein, one or more of the phases may be a continuous phase. The shape of the domains of the second phase, the third phase, or both may be generally elongated. Preferably the second phase, the third phase, or both, have a length to width ratio of about 20:1 or less, about 10:1 or less, or about 5:1 or less.

Figure 3B:
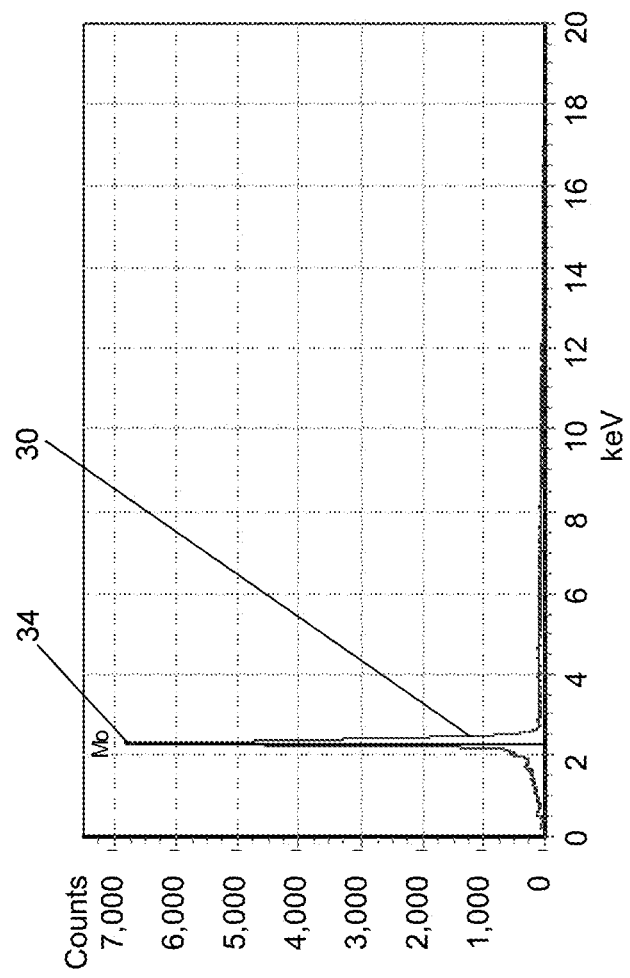
FIG. 3B is an illustrative energy dispersive x-ray spectroscopy graph showing the frequency distribution of x-rays having energy from 0 to 20 keV energy for a region of the sputter target of FIG. 3A.
Figure 3A:
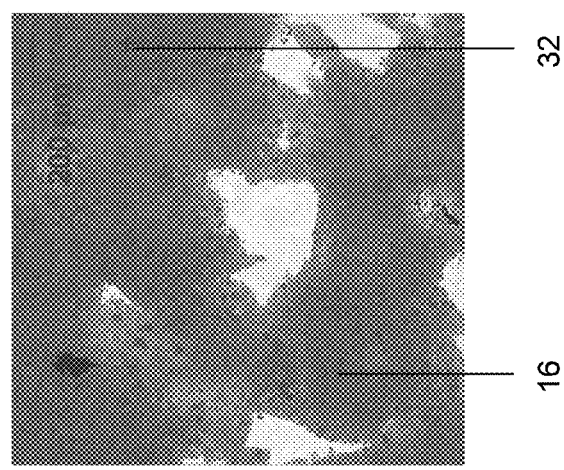
FIG. 3A is an illustrative scanning electron micrograph of a sputter target including molybdenum, niobium, and tantalum using backscattered electron imaging.

FIG. 3A is a scanning electron micrograph (backscattered electrons) of a region of a sputter target including molybdenum, niobium and tantalum including a molybdenum phase 16 and a point 32 in the molybdenum phase. FIG. 3B is an illustrative energy dispersive x-ray spectrograph taken at the point 32 of FIG. 3A. The spectrograph of FIG. 3B includes only a peak 34 corresponding to molybdenum. As illustrated by FIG. 3B, the sputter target may include a region that includes a phase of substantially pure molybdenum (i.e., including about 80 atomic % or more molybdenum, about 90 atomic % or more molybdenum, or about 95 atomic % or more molybdenum).

Figure 4B:
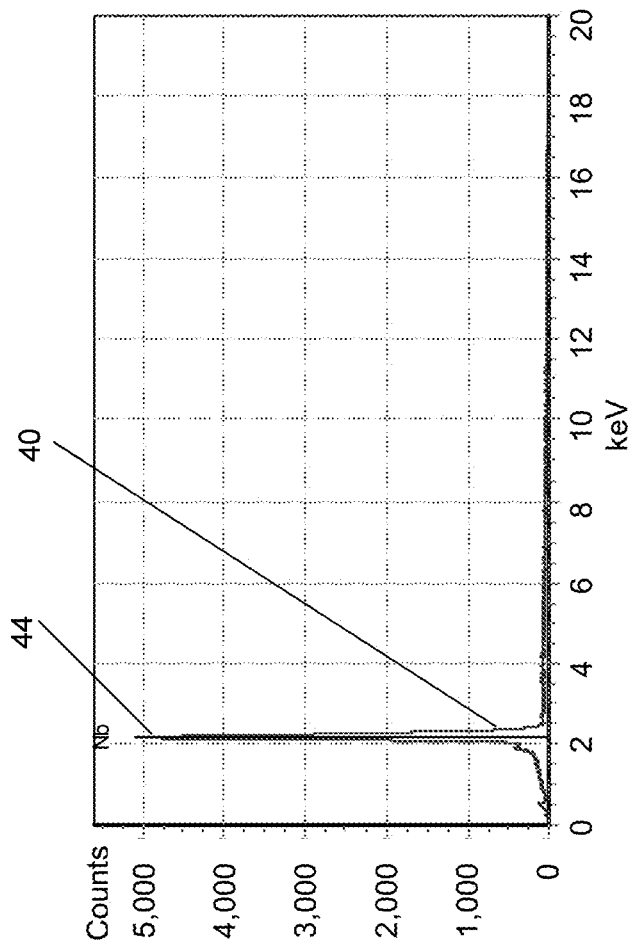
FIG. 4B is an illustrative energy dispersive x-ray spectroscopy graph showing the frequency distribution of x-rays having energy from 0 to 20 keV energy for a region of the sputter target of FIG. 4A.
Figure 4A:
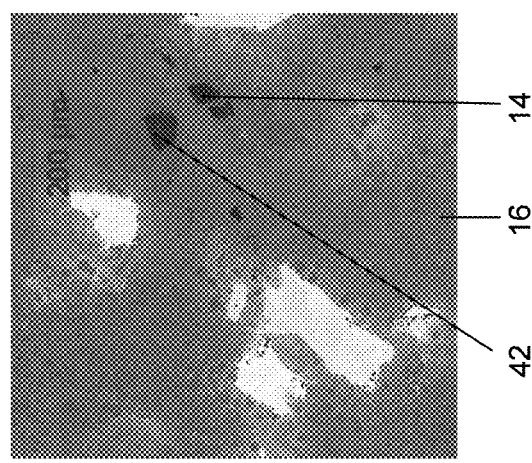
FIG. 4A is an illustrative scanning electron micrograph of a sputter target including molybdenum, niobium, and tantalum using backscattered electron imaging.

FIG. 4A is a scanning electron micrograph (backscattered electrons) of a region of a sputter target including molybdenum, niobium and tantalum including a niobium phase 14 and a point 42 in the niobium phase. FIG. 4B is an illustrative energy dispersive x-ray spectrograph taken at the point 42 of FIG. 4A. The spectrograph of FIG. 4B includes only a peak 44 corresponding to niobium. As illustrated by FIG. 4B, the sputter target may include a region that includes a phase of substantially pure second metal element (i.e., including about 80 atomic % or more of the second metal element, about 90 atomic % or more of the second metal element, or about 95 atomic % or more of the second metal element), such as a phase of substantially pure niobium, or a phase of substantially pure vanadium.

FIG. 5A is a scanning electron micrograph (backscattered electrons) of a region of a sputter target including molybdenum, niobium and tantalum including a tantalum phase 12, a molybdenum phase 16, and a point 52 in the tantalum phase. FIG. 5B is an illustrative energy dispersive x-ray spectrograph taken at the point 52 of FIG. 5A. The spectrograph of FIG. 5B includes only peaks 54, 54', 54'', and 54''' corresponding to tantalum. As illustrated by FIG. 5B, the sputter target may include a region that includes a phase of substantially pure third metal element (i.e., including about 80 atomic % or more of the third metal element, about 90 atomic % or more of the third metal element, or about 95 atomic % or more of the third metal element), such as a phase of substantially pure tantalum, a phase of substantially pure titanium, or a phase of substantially pure chromium.

FIG. 6A is a scanning electron micrograph (backscattered electrons) of a region of a sputter target including molybdenum, niobium and tantalum. The micrograph illustrates that the sputter target includes a niobium phase 14, a molybdenum phase 16, a molybdenum/niobium alloy phase 17, and a point 62 in the alloy phase 17. FIG. 68B is an illustrative energy dispersive x-ray spectrograph taken at the point 62 of FIG. 6A. The spectrograph of FIG. 6B includes both peaks 64 corresponding to Mo and 66 corresponding to Nb. As illustrated by FIG. 6B, the sputter target may include a region that includes an alloy phase including the second metal element and molybdenum, such as an alloy of niobium and molybdenum.

FIG. 7A is a scanning electron micrograph (backscattered electrons) of a region of a sputter target including molybdenum, niobium and tantalum. The micrograph illustrates that the sputter target includes a tantalum phase 12, a molybdenum phase 16, a molybdenum/tantalum alloy phase 19, and a point 72 in the alloy phase 19. FIG. 7B is an illustrative energy dispersive x-ray spectrograph taken at the point 72 of FIG. 7A. The spectrograph of FIG. 7B includes both peaks 74 corresponding to Mo and 76, 76' corresponding to tantalum. As illustrated by FIG. 7B, the sputter target may include a region that includes an alloy phase including the third metal element and molybdenum, such as an alloy of tantalum and molybdenum.

Molybdenum Concentration of the Sputter Target

The total concentration of molybdenum in the target may be about 50 atomic % or more, preferably about 55 atomic % or more, more preferably about 60 atomic % or more, even more preferably about 63 atomic % or more, and most preferably about 65 atomic % or more. The concentration of molybdenum in the target may be about 95 atomic % or less, preferably about 90 atomic % or less, more preferably about 85 atomic % or less, even more preferably about 83 atomic % or less, and most preferably about 81 atomic % or less.

Additional Elements:

In addition to the molybdenum, the target includes at least two additional metal elements (i.e., a second metal element and a third metal element). The second metal element and the third metal element may each independently have an atomic mass greater than or less than the atomic mass of molybdenum. For example, the second metal element may have an atomic mass than it less than the atomic mass of molybdenum and the third metal element may have an atomic mass that is greater than the atomic mass of molybdenum. As another example, the second metal element and the third metal element may both have an atomic mass less than the atomic mass of molybdenum. The second and third metal elements may be selected from IUPAC group 4, 5, and 6 elements. Preferably the target includes two or more elements (i.e., the second metal element and the third metal element) selected from the group consisting of titanium, tantalum, niobium, chromium, vanadium, hafnium, zirconium, and tungsten. More preferably the target includes two or more elements selected from the group consisting of titanium, tantalum, niobium, chromium, and vanadium. As such, the second metal element of the sputter target may be an element selected from the group consisting of titanium, tantalum, niobium, chromium, and vanadium. Similarly, the third metal element of the sputter target may be an element different from the second metal element and selected from the group consisting of titanium, tantalum, niobium, chromium, and vanadium. More preferred second metal elements include niobium and vanadium. Most preferably the second metal elements is niobium. More preferred third metal elements include an element selected from the group consisting of titanium, chromium, niobium, vanadium, and tantalum, with the proviso that the third metal element is different from the second metal element. Most preferably, the third metal element is tantalum.

Without limitation, exemplary targets include targets including, consisting essentially of, or consisting of: molybdenum, niobium, and tantalum; molybdenum, niobium and chromium; molybdenum, niobium, and vanadium; molybdenum, niobium, and titanium; molybdenum, vanadium, and tantalum; molybdenum, vanadium, and chromium; molybdenum, vanadium, and titanium; molybdenum, niobium, vanadium, and chromium; molybdenum, niobium, vanadium, and tantalum; molybdenum, niobium, vanadium, and titanium; or molybdenum, niobium, vanadium, titanium and tantalum. Preferred targets include targets including, consisting essentially of, or consisting of: molybdenum, niobium, and tantalum; molybdenum, niobium and chromium; molybdenum, niobium, and vanadium; molybdenum, niobium, and titanium; molybdenum, vanadium, and tantalum; molybdenum, vanadium, and chromium; or molybdenum, vanadium, and titanium. Most preferred targets include targets including, consisting essentially of, or consisting of molybdenum, niobium, and tantalum.

The concentration of the second metal element, the third metal element, or the combination of the second and third metal element in the sputter target may be about 0.1 atomic % or more, preferably about 0.5 atomic % or more, more preferably about 1 atomic % or more, even more preferably about 2 atomic % or more, and most preferably about 5 atomic % or more, based on the total concentration of atoms in the target. The concentration of the second metal element, the third metal element, or the combination of the second and third metal element in the sputter target may be less than about 50 atomic %, preferably about 45 atomic % or less, more preferably about 40 atomic % or less, even more preferably about 35 atomic % or less and most preferably about 30 atomic % or less, based on the total concentration of atoms in the target.

The theoretical density of the sputter target, $\rho_t$, may be calculated by the densities of the individual elements:

$$\rho_t = [(C_1W_1)+(C_2W_2)+(C_3W_3)]/[(C_1W_1/\rho_1)+(C_2W_2/\rho_2)+(C_3W_3/\rho_3)]$$

where $C_1$, $C_2$, $C_3$ are the concentrations (in atomic %) of molybdenum, the second metal element and the third metal element, respectively, $W_1$, $W_2$, $W_3$ are the atomic masses of molybdenum, the second metal element and the third metal element, respectively, and $\rho_1$, $\rho_2$, $\rho_3$ are the densities of molybdenum, the second metal element and the third metal element. In general, the theoretical density of a composition including n elements may be estimated by:

$$\rho_t = [\Sigma(C_iW_i)]/[\Sigma(C_iW_i/\rho_i)]$$

where the summations are from element i=1 to n, and $C_i$, $W_i$, and $\rho_i$ are respectively, the concentration, atomic mass, and density of element i.

The density of molybdenum, titanium, vanadium, chromium, niobium, and tantalum are about 10.2, 4.51, 6.11, 7.15, 8.57, and 16.4 g/cm$^3$, respectively. The density of the sputter target may be greater than about 0.85 $\rho_t$, preferably greater than about 0.90 $\rho_t$, more preferably greater than about 0.92 $\rho_t$, even more preferably greater than about 0.94 $\rho_t$, even more preferably greater than about 0.96 $\rho_t$, and most preferably greater than about 0.98 pt. The density of the sputter target is preferably less than about 1.00 Pt.

Texture of the Sputter Target

The texture of a sputter target may be determined by the orientation of the grains, such as the orientation of the grains of the first phase, the second phase, the third phase, or any combination thereof. For example, one or more of the phases may generally be oriented with <110>//ND, <111>//ND, <100>//ND, or a combination thereof. The rates at which the sputter target is sputtered (e.g., the deposition rate of a sputtered film) may depend on the orientation of the grains. As such, in some aspects of the invention, the sputter target has a generally uniform orientation. The orientation of the grains may be measured by electron back scattered diffraction, using the method described in U.S. Patent Application Publication No. 2008/0271779A1 (Miller et al., published Nov. 6, 2008) and International Patent Application Publication No. WO 2009/020619 A1 (Bozkaya et al., published Feb. 12, 2009), the contents of which are both incorporated herein by reference in their entirety. Thus measured, in a unit volume of a face centered cubic metal the percentage of grains aligned within 15-degrees of <100>//ND may be greater than about 5%, greater than about 8%, greater than about 10.2%, greater than about 13%, or greater than about 15%, the percentage of grains aligned within 15-degrees of and <111>/ND may be greater than about 5%, greater than about 10%, greater than about 13.6%, or greater than about 15%, or greater than about 18%, or any combination thereof. Thus measured, the percentage of grains in a unit volume of a body centered cubic metal aligned within 15 degrees of <110>//ND may be greater than about 5%, greater than about 15%, 20.4% or greater than about 30%. The standard deviation of the texture gradient (e.g., the 100 gradient, the 111 gradient, or both) may be less than about 4.0, preferably less than about 2.0, more preferably less than about 1.7, even more preferably less than about 1.5, even more preferably less than about 1.3, and most preferably less than about 1.1.

The variation in the orientation in the through-thickness direction may also be relatively low. For example, through-thickness texture gradient for the texture components 100//ND, 111//ND, or both may be 6%/mm or less, preferably 4%/mm or less, and more preferably 2%/mm or less (as measured using the method described in International Patent Application Publication No. WO 2009/020619 A1).

Deposited Molybdenum Containing Layer

As previously described, the sputter targets may be used to produce a structure having at least one molybdenum containing layer (e.g., a deposited layer, such as a deposited film layer) that comprises molybdenum, a second metal element, and a third metal element. For example, the sputter target may be used to produce a deposited layer comprising molybdenum, a second metal element selected from niobium and vanadium, and a third metal element different from the second metal element, wherein the third metal element is selected from the group consisting of titanium, chromium, niobium, vanadium, and tantalum. Preferably the second metal element is niobium. Preferably the third metal element is tantalum. Most preferably the second metal element is niobium and the third metal element is tantalum. The process of depositing a molybdenum containing layer on a substrate may include one or any combination of the following: providing a particle, such as a charged particle, accelerating a particle, or impacting a sputter target with a particle, so that atoms are removed from a sputter target and deposited onto a substrate. Preferred particles include atomic particles and subatomic particles. By way of example, the subatomic particle may be an ion. The sputter target may be employed to deposit a molybdenum containing layer including about 50 atomic % or more molybdenum, about 0.5 atomic % or more of the second metal element, and about 0.5 atomic % or more of the third metal element, based on the total number of atoms in the layer. The concentration of molybdenum in the molybdenum containing layer may be about 60 atomic % or more, about 65 atomic % or more, about 70 atomic % or more, or about 75 atomic % or more, based on the total concentration of atoms in the molybdenum containing layer. The concentration of molybdenum in the molybdenum containing layer may be about 98 atomic % or less, preferably about 95 atomic % or less, more preferably about 90 atomic % or less, even more preferably about 85 atomic % or less, and most preferably about 83 atomic % or less, based on the total number of atoms in the molybdenum containing layer. The ratio of the concentration of molybdenum (in atomic %) in the deposited layer to the concentration of molybdenum in the sputter target (in atomic %) may be about 0.50 or more, about 0.67 or more, about 0.75 or more, about 0.80 or more, or about 0.9 or more. The ratio of the concentration of molybdenum in the deposited layer to the concentration of molybdenum in the sputter target may be about 2.00 or less, about 1.5 or less, about 1.33 or less, about 1.25 or less, or about 1.11 or less.

The second metal element and the third metal element may each independently be present at a concentration about 0.1 atomic % or more, preferably about 1 atomic % or more, more preferably about 3 atomic % or more, even more preferably greater 5 atomic % or more, and most preferably about 7 atomic % or more, based on the total concentration of atoms in the molybdenum containing layer. The second metal element and the third metal element may each independently be present at a concentration of about 40 atomic % or less, about 35 atomic % or less, about 30 atomic % or less, about 25 atomic % or less, about 20 atomic % or less, or about 10 atomic % or less, based on the total concentration of atoms in the molybdenum containing layer.

The total concentration of the second and third metal elements is preferably about 5 atomic % or more, more preferably about 10 atomic % or more, and most preferably about 15 atomic % or more, based on the total concentration of atoms in the molybdenum containing layer. By way of example, the total concentration of the second and third metal elements may be about 20 atomic % or more, based on the total concentration of atoms in the molybdenum containing layer. The total of the second metal element and the third metal element may be about 50 atomic % or less, about 45 atomic % or less, about 40 atomic % or less, about 35 atomic % or less, about 30 atomic % or less, or about 25 atomic % or less, based on the total concentration of atoms in the molybdenum containing layer. The ratio of the total concentration of the second and third metal elements (in atomic %) in the deposited layer to the total concentration of the second and third metal elements in the sputter target (in atomic %) may be about 0.50 or more, about 0.67 or more, about 0.8 or more, or about 0.9 or more. The ratio of the total concentration of the second and third metal elements (in atomic %) in the deposit layer to the total concentration of the second and third metal elements in the sputter target (in atomic %) may be about 2.00 or less, about 1.5 or less, about 1.25 or less, or about 1.11 or less.

The deposited molybdenum containing layer may be deposited (e.g., by a process that includes a step of sputtering the sputter target) onto a substrate. As such, one aspect of the invention is a multi-layered material having at least a first deposited molybdenum containing layer including a first phase of the deposited layer having about 50 atomic % or more molybdenum, about 0.1 atomic % or more of the second metal element and about 0.1 atomic % or more of the third metal element, wherein the second metal element is niobium or vanadium, and the third metal element is a metal element different from the second metal element and selected from the group consisting of titanium, chromium, niobium, vanadium, and tantalum. The first phase of the molybdenum containing layer may comprise 60 volume % or more, 70 volume % or more, 80 volume % or more, 90 volume % or more, or 95 volume % or more of the molybdenum containing layer. The molybdenum containing layer may be substantially entirely the first phase of the deposited layer. The concentration of the molybdenum, the second metal element, and the third metal element in the first phase of the deposited molybdenum containing layer may be any of the above described concentrations for the molybdenum, the second metal element, and the third metal element in the molybdenum containing layer.

The deposited layer may have an average grain size of about 5 to 10,000 nm. The average grain size may be measured using microscopy (e.g., scanning electron microscopy) of a surface normal to the thickness of the deposited layer. The size of an individual grain may be taken as the largest dimension of the grain in the plane normal to the thickness of the deposited layer. The deposited layer (e.g., the first phase of the deposited layer) preferably has a relatively small grain size (e.g., a grain size less than the grain size of the first phase of the sputter target, the second phase of the sputter target, the third phase of the sputter target, or any combination thereof). The first phase of the deposited layer may have a grain size of about 5 nm or more, about 10 nm or more, about 20 nm or more, or about 50 nm or more. The first phase of the deposited film layer may have a grain size of about 10,000 nm or less. Preferably, the first phase of the deposited film layer has a grain size of about 1000 nm or less, about 500 nm or less, about 200 nm or less, or about 150 nm or less. The grains may be generally randomly oriented, the grains may be generally aligned, or any combination thereof. The grains may have any shape. For example, the grains may be generally elongated. Preferably, the grains have a length to width ratio that is less than about 100:1, more preferably less than about 30:1, and most preferably less than about 10:1. The deposited layer may include grains that have a generally large length to width ratio (e.g., greater than about 5:1 and grains that have a generally small length to width ratio (e.g., less than about 5:1, or less than about 2:1). The grains may have a generally uniform shape, such as a shape having a length to width ratio less than about 3:1, less than about 2:1, or less than about 1.5:1.

Figure 8A:
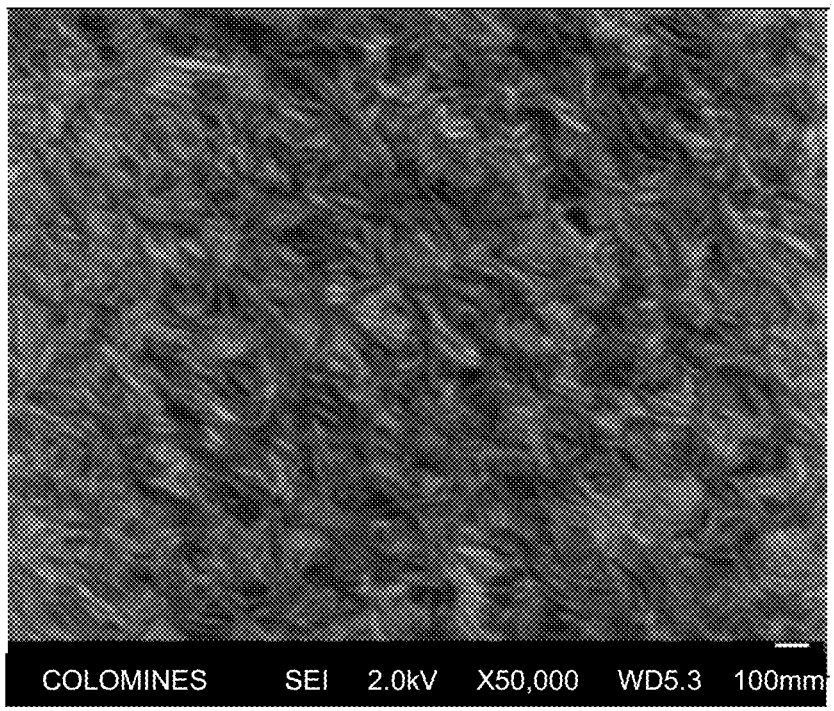

By way of example, FIG. 8A illustrates (without limitation) a microstructure using secondary electron scanning electron microscopy at a magnification of about 50,000 of a deposited layer containing about 80 atomic % molybdenum, about 10 atomic % of the second metal element, and about 10 atomic % of the third metal element. With reference to FIG. 8A, the deposited layer may be substantially a single phase.

The thickness of the deposited molybdenum containing layer may vary depending on the functional requirements of the deposited layer. Without limitation, the thickness of the deposited layer may be about 1 nm or more, about 5 nm or more, about 10 nm or more, about 15 nm or more, about 20 nm or more, about 25 nm or more, about 30 nm or more, or about 35 nm or more. The thickness of the deposited molybdenum containing layer may be about 3 μm or less. Preferably, the thickness of the deposited molybdenum containing layer is about 1 μm or less, more preferably about 0.5 μm or less, even more preferably about 0.2 μm or less, even more preferably about 100 nm or less, and most preferably about 50 nm or less. Deposited layers having a thickness less than about 1 nm are also contemplated.

FIG. 9 is a secondary electron scanning electron microscope micrograph (at a magnification of about 10,000) of the cross-section of a deposited layer 90 containing about 80 atomic % molybdenum, 10 atomic % of the second metal element, and about 10 atomic % of the third metal element on a substrate 92. As illustrated in FIG. 9, the deposited layer may include a generally columnar microstructure. Other microstructures are also contemplated.

The arrangement of the atoms in the deposited molybdenum containing layer may be different from the arrangement of the atoms in the sputter target. For example, the deposited layer may include one or more first alloy phases comprising i) at least 50 atomic % molybdenum and ii) at least one of the second metal element and the third metal element. As such the deposited layer may be substantially free of (e.g., contain less than 30 volume %, more preferably less than about 10 volume %, and most preferably less than about 5 volume %, based on the total volume of the deposited layer) of phases comprising greater than about 90 atomic % molybdenum. Preferably, a majority of the second metal element in the deposited layer is present in the one or more first alloy phases. Preferably, a majority or the third metal element in the deposited layer is present in the one or more first alloy phases.

Without limitation, the deposited layer may include a first phase that contains about 70% or more of the molybdenum in the deposited layer, preferably about 80% or more of the molybdenum in the deposited layer, more preferably about 90% or more of the molybdenum in the deposited layer, and most preferably about 95% or more of the molybdenum in the deposited layer. Without limitation, the deposited layer may include a first phase that further contains about 70% or more of the second metal element in the deposited layer, preferably about 80% or more of the second metal element in the deposited layer, more preferably about 90% or more of the second metal element in the deposited layer, and most preferably about 95% or more of the second metal element in the deposited layer. Without limitation, the deposited layer may include a first phase that further contains about 70% or more of the third metal element in the deposited layer, preferably about 80% or more of the third metal element in the deposited layer, more preferably about 90% or more of the third metal element in the deposited layer, and most preferably about 95% or more of the third metal element in the deposited layer.

The deposited layer may be deposited onto a substrate using a physical vapor deposition process, such as a sputter deposition process (i.e., by sputtering). The deposition process may employ electric fields and/or magnetic fields (preferably both) to remove atoms or groups of atoms from the sputter target using a gas (preferably an inert gas, such as argon) and to deposit at least a portion of the removed atoms onto a substrate. The deposition process may employ one or more steps of heating a sputter target, one or more steps of etching a sputter target and/or substrate (for example to remove an oxide layer), one or more steps of cleaning a sputter target and/or substrate, or any combination thereof. The sputtering may be performed in a vacuum chamber at a pressure less than atmospheric pressure. The pressure, temperature, and electric fields may be chosen so that a plasma is formed. By way of example, the process may include sputtering at one or more pressures of about 100 Torr or less (about 13.3 kPa or less), preferably about 1000 mTorr or less (about 133 Pa or less), more preferably about 100 mTorr or less (about 13.3 Pa or less), and most preferably about 20 mTorr or less (about 2.67 Pa or less). The process preferably includes sputtering at one or more pressures of about 0.1 mTorr or more (about 0.0133 Pa or more), preferably about 1 mTorr or more (about 0.133 Pa or more), and more preferably about 2 mTorr or more (about 0.267 Pa or more).

Optionally, the deposited layer may contain one or more second alloy phases, each containing about 50 atomic % or less molybdenum. If present, such optional second alloy phases preferably are present in total concentration of about 40 volume % or less, more preferably about 30 volume % or less, even more preferably about 20 volume % or less, and most preferably about 10 volume % or less, based on the total volume of the deposited layer. Without limitation, the one or more second alloy phase of the deposited layer, if present, may each include at least 25 atomic % of the second metal, at least 25 atomic % of the third metal element, at least 50 atomic % of the second metal and third metal, based on the total number of atoms in the second alloy phase, or any combination thereof.

Without limitation, the deposited molybdenum containing layer may function as a barrier layer, such as for performing the function of substantially or entirely avoiding the migration of atoms of an underlying layer into an overlying layer, substantially or entirely avoiding the migration of atoms of an overlying layer into an underlying layer, or both. For example, the deposited molybdenum containing layer may be deposited over a first material (e.g., a first substrate material) and then have a second material deposited over it. As such, the deposited molybdenum containing layer may prevent the migration (e.g., during an annealing step, during a forming step, or during use) of the one or more components (i.e., molecules or elements) of the first material into the second material, one or more components (i.e., molecules or elements) of the second material into the first material, or both. The molybdenum containing layer may be interposed between a substrate (e.g., a silicon substrate, or a glass substrate) and a conductive layer (such as a layer containing or consisting essentially of Cu, Al, Ag, Au, or any combination thereof). The thickness of the deposited molybdenum containing layer (e.g., employed as a barrier layer) may be about 1000 nm or less, about 500 nm or less, about 200 nm or less, about 100 nm or less, or about 50 nm or less. The thickness of the deposited molybdenum containing layer (e.g., employed as a barrier layer) may be about 1 nm or more. The molybdenum containing layer may include about 50 atomic % or more molybdenum (e.g., about 80 atomic % molybdenum), about 1 atomic % or more of a second metal element (e.g., about 10 atomic niobium), and about 1 atomic % or more of a third metal element (e.g., about 10 atomic % tantalum).

The materials may then be annealed, e.g., using an annealing temperature of about 350° C. and an annealing time of about 30 minutes to determine the barrier properties of the molybdenum containing layer. The molybdenum containing layer may advantageously substantially if not entirely avoid the migration of components of the substrate layer into the conductive layer and/or the molybdenum containing layer, reduce or prevent the migration of components of the conductive layer into the substrate layer and/or the molybdenum containing layer, or any combination thereof. Without limitation, the molybdenum containing layer may advantageously reduce or prevent the formation of copper silicide after annealing for about 30 minutes at about 350° C. For example, the concentration of copper silicide may be below the level detectable by x-ray diffraction methods after annealing for about 30 minutes at about 350° C. The deposited molybdenum containing layer may be employed to avoid changes in the electrical resistivity of the deposited layers (e.g., each layer, or the combination of the deposited layers) by an annealing process. Preferably the electrical resistivity changes by less than about 30%, more preferably by less than about 20%, and most preferably by less than 10%, after annealing for about 30 minutes at a bout 350° C. Such a generally constant electrical resistivity may indicate that the molybdenum containing layer is preventing the formation of a silicide, such as copper silicide. The deposited layer may avoid the migration of copper atoms into a silicon layer, migration of silicon atoms into a copper layer, or both. For example the concentration of copper atoms at the surface of the silicon layer may be less than 1 atomic %, preferably less than about 0.1 atomic % and most preferably below the limit of detection as measured by Auger spectroscopy after annealing a structure comprising a deposition layer including molybdenum, the second metal element and the third metal element on a clean silicon wafer, deposited by sputtering the sputter target using a magnetron, the deposition layer having a thickness of about 25 nm, and a layer of copper deposited over the deposition layer, the annealing at a temperature of about 350° C. and a time of about 30 minutes. Under the same conditions, the concentration of silicon atoms at the surface of the copper layer may be about 1 atomic % or less, preferably about 0.1 atomic % or less, and most preferably below the limit of detection as measured by Auger spectroscopy.

Figure 10A:
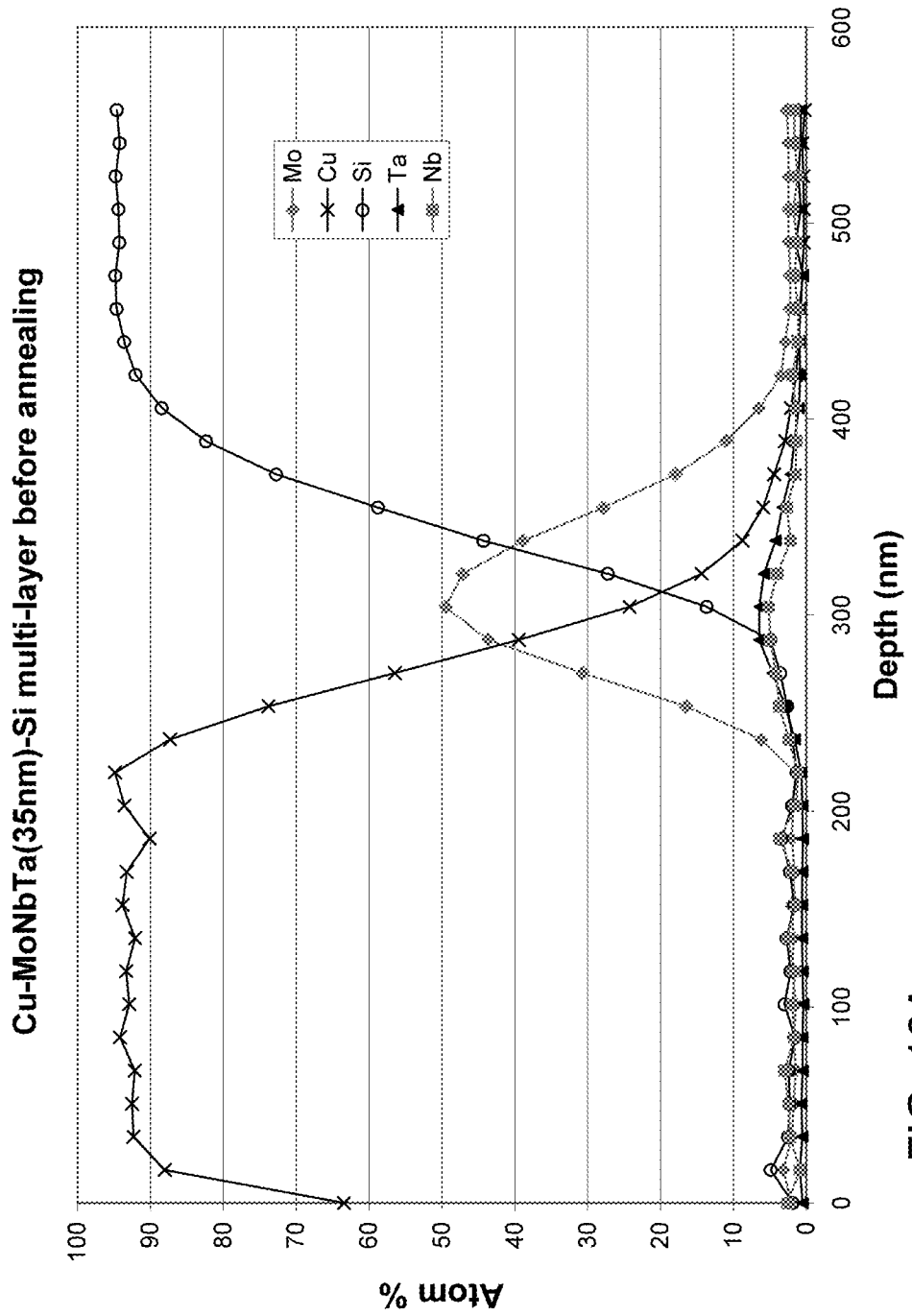
FIGS. 10A, 10B and 10C are illustrative Auger Spectra of a multilayered structure including a silicon substrate, a first sputtered layer including molybdenum, niobium and tantalum, and a second sputtered layer of copper. The spectra illustrate the compositions of Cu, Si, Ta, Nb, and Mo versus depth, before (FIG. 10A) and after (FIG. 10B) annealing for about 30 minutes at about 350° C.
Figure 10B:
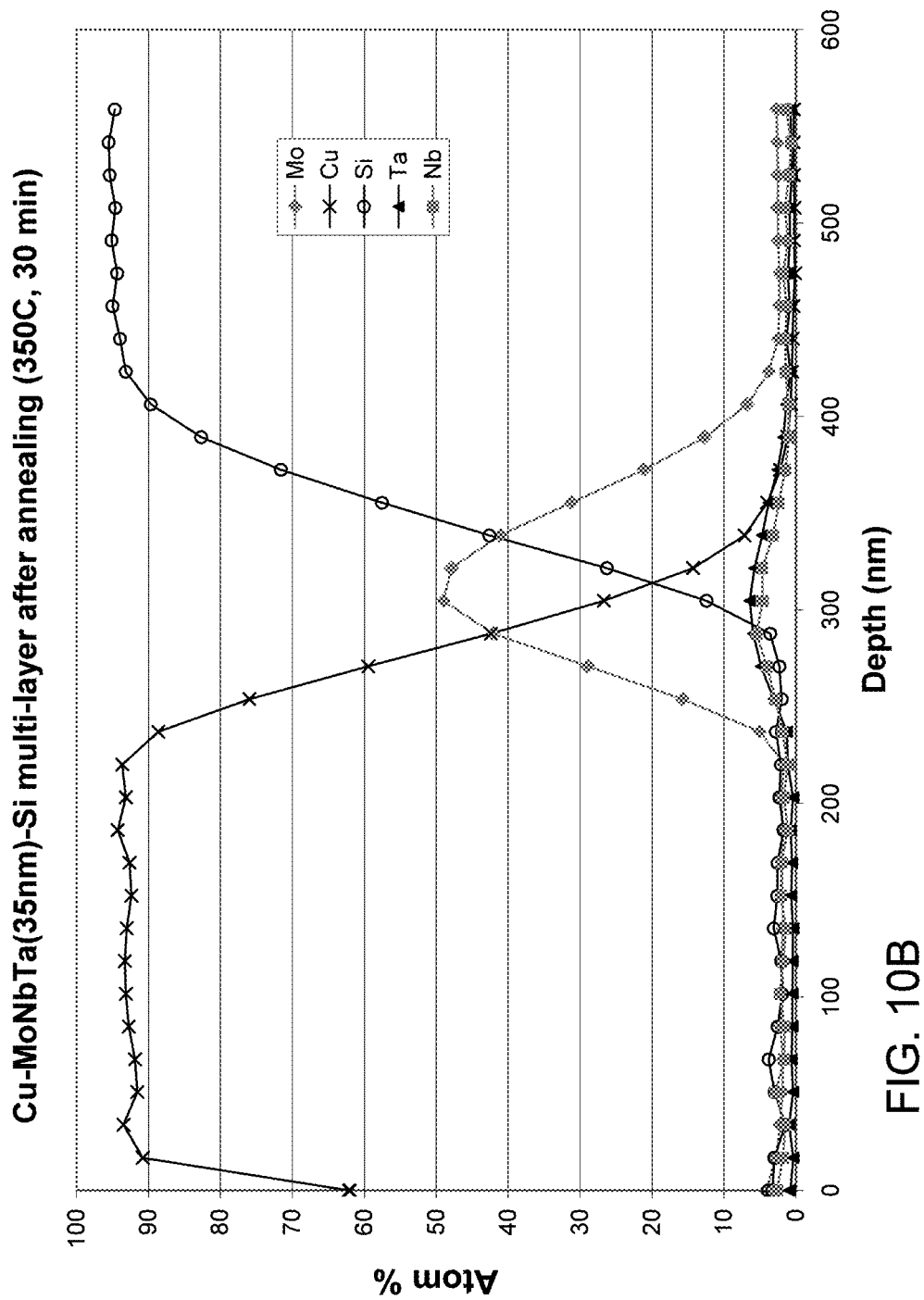

By way of illustration, FIG. 10A illustrates (without limitation) the Auger depth profile of a silicon substrate with a deposited molybdenum containing layer and a conductive copper layers. With reference to FIG. 10A, the molybdenum containing layer may be interposed between the silicon substrate and the conductive layer. As illustrated in FIG. 10A, the molybdenum containing layer may include about 50 atomic % or more molybdenum (e.g., about 80 atomic % molybdenum), about 1 atomic % or more of a second metal element (e.g., about 10 atomic niobium), and about 1 atomic % or more of a third metal element (e.g., about 10 atomic % tantalum). The materials may then be annealed, e.g., using an annealing temperature of about 350° C. and an annealing time of about 30 minutes to determine the barrier properties of the molybdenum containing layer. As illustrated in FIG. 10B, the molybdenum containing layer may advantageously substantially if not entirely avoid the migration of silicon atoms from the substrate layer into the copper layer and/or the molybdenum containing layer, reduce or prevent the migration of copper atoms from the conductive layer into the silicon layer and/or the molybdenum containing layer, or any combination thereof. Without limitation, the molybdenum containing layer may advantageously reduce or prevent the formation of copper silicide after annealing for about 30 minutes at about 350° C.

The deposited molybdenum containing layer may be characterized by one or any combination of the following: a generally good adhesion to glass (e.g., at least 2B, at least 3B, at least 4B, or at least 5B rating when tested according to ASTM B905-00), a generally good adhesion to silicon (e.g., at least 2B, at least 3B, at least 4B, or at least 5B rating when tested according to ASTM B905-00), a generally good adhesion (e.g., at least 2B, at least 3B, at least 4B, or at least 5B rating when tested according to ASTM B905-00) to a conductive layer, such as a layer containing or consisting essentially of copper, aluminum, chromium, or any combination thereof ability to prevent copper silicide formation when the molybdenum containing deposited layer (e.g., having a thickness of about 200 nm or less, preferably having a thickness of about 35 nm or less, and more preferably having a thickness of about 25 nm or less) is placed between and in contact with Si and Cu and annealed for about 30 minutes at about 350° C.; or an electrical resistivity less than about 60, preferably less than about 45, more preferably less than about 35 µΩ·cm for a film having a thickness of about 200 nm.

The deposited molybdenum containing layer may have a relatively low electrical resistivity. For example, the electrical resistivity of the molybdenum containing layer may be less than the electrical resistivity of a deposited layer of the same thickness consisting of 50 atomic % molybdenum and 50 atomic % titanium.

Preferably the deposited molybdenum containing layer has a generally low electrical resistivity. For example, the electrically resistivity (as measured by a four-point probe on a film having a thickness of about 200 nm) of the deposited molybdenum containing layer preferably is of about 75 µΩ·cm or less, more preferably about 60 µΩ·cm or less, even more preferably about 50 µΩ·cm or less, even more preferably about 40 µΩ·cm or less, even more preferably about 30 µΩ·cm or less, even more preferably about 28 µΩ·cm or less, even more preferably about 25 µΩ·cm or less, and most preferably about 20 µΩ·cm or less. Preferably, the electrically resistivity of the deposited molybdenum containing layer is about 5 µΩ·cm or more. It will be appreciated that the electrical resistivity of the deposited molybdenum containing layer may also be less than about 5 µΩ·cm. The deposited molybdenum containing layer preferably has a generally uniform electrical resistivity. For example the ratio of the standard deviation of the electrical resistivity to the average electrical resistivity (measured on a 200 nm thick layer deposited on a 76.2 mm diameter silicon wafer) preferably is about 0.25 or less, more preferably about 0.20 or less, even more preferably about 0.12 or less, even more preferably about 0.10 or less, and most preferably about 0.06 or less.

Etching of the Deposited Molybdenum Containing Layer

After depositing the molybdenum containing layer it may be desirable to at least partially etch the molybdenum containing layer. By way of example, a step of etching may be employed so that a portion of a layer underlying the molybdenum containing layer becomes exposed (e.g., until another layer, such as a conductive layer, is deposited). It may be desirable for the etch rate of the molybdenum containing layer to be generally high so that short etching times may be employed, so that milder etching chemicals may be used, so that thicker molybdenum containing layers may be employed, or any combination thereof.

The step of etching may include a step of etching with a chemical or solution capable of removing some or all of the deposited molybdenum containing layer. More preferably, the etching step includes sufficiently etching the molybdenum layer so that a layer below the molybdenum layer, such as a substrate layer, is at least partially exposed after the etching step. The etching step may employ a solution or chemical that includes an acid. For example, the etching step may employ a solution or chemical having a pH of about 8 or more, a pH of about 10 or more, or a pH of about 12 or more. The etching step may employ a solution or chemical that includes a base. For example, the etching step may employ a solution or chemical having a pH of about 6 or less, a pH of about 4 or less, or a pH of about 2 or less. The etching step may employ a solution or chemical that is generally neutral. Generally neutral solutions or chemicals have a pH greater than about 6, a pH of about 6.5 or more, a pH or about 6.8 or more, or a pH of about 7 or more. Generally neutral solutions or chemicals also have a pH less than about 8, a pH of about 7.5 or less, a pH or about 7.2 or less, or a pH of about 7 or less.

The etching process may employ one or more acids. Exemplary acids that may be used include nitric acid, sulfuric acid, hydrochloric acid, and combinations thereof. The etching process may employ a sulfate. Exemplary sulfates include those described in U.S. Pat. No. 5,518,131, column 2, lines 3-46 and column 2, lines 62 to column 5, line 54, expressly incorporated herein by reference, such as ferric sulfate and ferric ammonium sulfate. The etching process may employ a solution including ferricyanide ions, chromate ions, dichromate ions, ferric ions, or any combination thereof. For example, the etching process may employ one or more ions containing solutions described in U.S. Pat. No. 4,747,907, column 1, line 66 to column 8, line 2, incorporated by reference herein. A particularly preferred solution for etching the molybdenum containing layer is a solution including ferricyanide ions.

Preferably, the process of preparing the multi-layered structure includes a step of etching the molybdenum containing layer at a rate of about 75 nm/min or more, more preferably about 100 nm/min or more, even more preferably about 150 nm/min or more, even more preferably about 200 nm/min or more, even more preferably about 300 nm/min or more, even more preferably about 400 nm/min or more, and most preferably about 500 nm/min or more. The etching step may employ any etching solution capable of etching the molybdenum containing layer. The etching step may employ a ferricyanide solution at one or more of the above rates.

The deposited molybdenum containing layer may have a relatively high etch rate in ferricyanide solution at 25° C., such as an etch rate greater than the etch rate of a deposited layer consisting of 50 atomic % molybdenum and 50 atomic % titanium using the same etching conditions. For example, the etch rate of the deposited molybdenum containing layer in ferricyanide solution at 25° C. may be about 75 nm/min or more, preferably about 100 nm/min or more, more preferably about 150 nm/min or more, even more preferably about 150 nm/min or more, even more preferably about 200 nm/min or more, even more preferably about 300 nm/min or more, even more preferably about 400 nm/min or more, and most preferably greater than about 500 nm/min. The etch rate of the deposited molybdenum containing layer in ferricyanide solution at 25° C. is preferably about 10,000 nm/min or less, and most preferably about 2,000 nm/min or less.

Process

In general, the targets (or preformed structures, such as blocks for assembling into a target) may be made using metal powder starting materials. One such approach includes consolidating such powders, such as by heat, pressure, or both. For example, powders may be compacted and sintered, cold isostatically pressed, hot isostatically pressed, or any combination thereof.

The process for making the target may include one or any combination of the steps disclosed by Gaydos et al. in U.S. Patent Application Publication Nos. 2007/0089984A1, published on Apr. 26, 2007 and US2008/0314737, published on Dec. 25, 2008, the contents of which are incorporated herein by reference in their entirety.

The process for making the sputter targets may include a step of providing at least a first powder including about 50 atomic % or more molybdenum, a second powder including about 50 atomic % or more of a second metal element, and a third powder including about 50 atomic % or more of a third metal element, wherein the second metal element is niobium or vanadium, and the third metal element is a different element from the second metal element and selected from the group consisting of titanium, chromium, niobium, vanadium, and tantalum. The individual powders (e.g., the first powder, the second powder and the third powder) may be blended together to produce a blended powder. The process may optionally include one or more step of consolidating the blended powder to produce a consolidated powder. The blending step preferably uses a temperature sufficiently low so that powder does not fuse together. The blending preferably uses a sufficient blending time and speed so that the first powder, the second powder, and the third powder become generally randomly distributed. By way of example, the blending may be performed at a temperature below about 100° C. (e.g., at about 25° C.) in a V-blender.

Preferably the process of preparing the sputter target is free of a step of mixing (e.g., mechanically mixing) two or more of the first powder, the second powder, and the third powder at a temperature at which an alloy is formed. For example, the process may be free of a step of mixing two or more of the first powder, the second powder, and the third powder at a temperature of about 550° C. or more, about 700° C. or more, about 900° C. or more, about 1100° C. or more, about 1200° C. or more, or about 1500° C. or more.

The process may include one or more steps of encapsulating the blended powder or the consolidated powder to produce an encapsulated powder and/or one or more steps of compacting while heating the encapsulated powder to produce a first target plate.

Preferably, the process of preparing the sputter target includes one or more steps of pressing the powders or the consolidated powders to form a target plate (e.g., a block or blank) by pressing at a predetermined time, at a predetermined pressing pressure, and for a predetermined pressing temperature sufficiently high so that the powders fuse together, so that the density of the material increases to at about 0.85 $\rho_t$ or more, where $\rho_t$ is the theoretical density. The target plate (e.g., the block or blank) may be further processed (e.g., as described hereinafter) to form a sputter target. As such, it will be recognized that target plates and methods for producing target plates are included in the teachings herein. Various compacting methods are known in the art, including, but not limited to, methods such as inert gas uniaxial hot pressing, vacuum hot pressing, and hot isostatic pressing, and rapid omnidirectional compaction, the Ceracon™ process. The pressing step preferably includes a step of hot isostatically pressing the powder. Preferably the predetermined temperature is about 800° C. or more, more preferably about 900° C. or more, even more preferably about 1000° C. or more, even more preferably about 1100° C. or more, and most preferably about 1200° C. or more. Preferably the predetermined temperature is about 1700° C. or less, more preferably about 1600° C. or less, even more preferably about 1500° C. or less, even more preferably about 1400° C. or less, and most preferably about 1300° C. or less. The predetermined pressing time may be about 1 minute or more, preferably about 15 minutes or more, and more preferably about 30 minutes or more, the predetermined time preferably is about 24 hours or less, more preferably about 12 hours or less, even more preferably about 8 hours or less, and most preferably about 5 hours or less. The predetermined pressing pressure may be about 5 MPa or more, about 20 MPa or more, about 50 MPa or more, or about 70 MPa or more. The predetermined pressure may be about 1000 MPa or less, preferably about 700 MPa or less, more preferably about 400 MPa or less and most preferably about 250 MPa or less.

The process for making a target may optionally include a step of bonding (two or more target plates (e.g., a first target plate and a second target plate) to produce a bonded target plate. By way of example, the step of bonding may be a step of edge bonding. The bonding process may be a diffusion bonding process. A bonding step may be advantageous in producing targets having a relatively large area (e.g., a length greater than about 67 inches (1702 mm), or greater than about 84 inches (2134 mm) and a width greater than about 55 inches (1397 mm), or greater than about 70 inches (1778 mm).

As taught herein, in a preferred aspect of the invention, a target plate formed by pressing may be capable of being rolled so that the length of the target plate is increased, so that the width of the target plate is increased, or both. As such, the process of forming the sputter target may be substantially free of, or even entirely free of a step of a bonding (e.g. edge bonding) two or more target plates. It will be appreciated that one or more steps of rolling the target plate may be employed. By rolling the target plate, the need for large molds and/or large presses (such as molds and/or presses that are at least about the size of the final sputter target) may be avoided. One or more steps of rolling may be advantageous in producing sputter targets having a relatively large area (e.g., a length greater than about 67 inches (1702 mm), or greater than about 84 inches (2134 mm) and a width greater than about 55 inches (1397 mm), or greater than about 70 inches (1778 mm)).

Forging

The process for making the target may optionally include one or more steps of forging. If employed, the forging step may include hot forging (e.g., at a temperature above a recrystallization temperature of the target material). Suitable forging methods that may be used include press forging, upset forging, automatic hot forging, roll forging, precision forging, induction forging, and any combination thereof. Without limitation, the forging process may employ rotary axial forging as described for example in International Patent Application Publication No. WO2005/108639 A1 (Matera et al., published on Nov. 17, 2005), the contents of which are incorporated herein by reference in its entirety. A rotary axial forging process may employ a rotary axial forging machine such as one described in Paragraph 0032 of WO2005/108639 A1.

Reducing/Eliminating Variation in Texture

The process for making the target may include a step of tilt rolling or other asymmetric rolling, using a method or apparatus such as described in International Patent Application No. WO 2009/020619 A1 (Bozkaya et al, published on Feb. 12, 2009), the contents of which are incorporated herein by reference in its entirety.

Applications

The sputter targets may be employed in producing one or more layers (e.g., as one or more barrier layers) in an electrode substrate of a flat panel display or a photovoltaic cell. Examples of flat panel displays which may advantageously employ the sputter targets of the present invention include a liquid crystal display (e.g., an active matrix liquid crystal display, such as a thin film transistor-liquid crystal display (i.e., a TFT-LCD)), a light emitting diode, a plasma display panel, a vacuum fluorescent display, a field emission display, an organoluminescent display, an electroluminescent displays, and an electro-chromic displays.

Devices that may include molybdenum containing films prepared from the sputter targets include computer monitors, optical disks, solar cells, magnetic data storage, optical communications, decorative coatings, hard coatings, glass coatings including WEB coatings, cameras, video recorders, video games, cell phones, smartphones, touch screens, global positioning satellite devices, video scoreboards, video billboards, other display panels, or the like.

Figure 11:
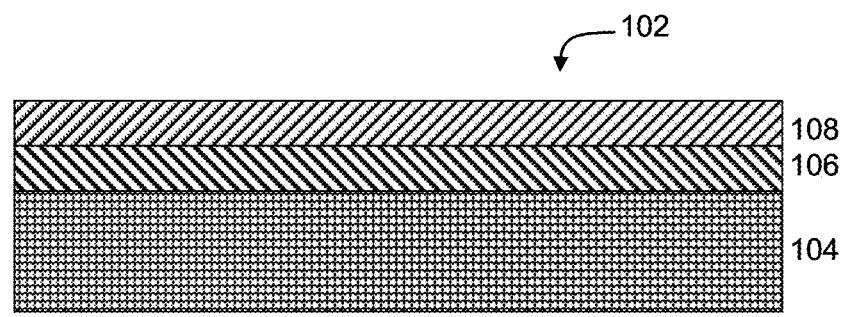
FIG. 11 is an illustrative multi-layered structure including a substrate layer, a molybdenum containing layer, and a conductive layer. The molybdenum containing layer preferably is deposited from a sputter target including a molybdenum rich phase, a niobium rich phase and a tantalum rich phase.

With reference to FIG. 11, one such device may include a multi-layered structure 102. The multi-layered structure includes two or more layers including a substrate layer 104 and a deposited molybdenum containing layer 106. The substrate layer may be formed of a glass, a semiconductor, a metal, a polymer, or any combination thereof. It will be appreciated that the substrate layer may include a plurality of materials. A preferred substrate layers includes or consists essentially of glass. Another preferred substrate layer includes or consists essentially of silicon. The multi-layered structure includes one or more deposited layers 106. The deposited layer 106 may be formed by a sputter method according to the teachings herein, may be formed from a sputter target according to the teachings herein, or both. The deposited layer 106, may be a thin film. The deposited layer may have a thickness less than the thickness of the substrate layer 102. The deposited layer may have a thickness less than about 1 μm, even more preferably less than about 200 nm, even more preferably less than about 100 nm, and most preferably less than about 50 nm. The deposited layer 106 may be deposited onto the substrate 104, or the deposited layer 106 may be deposited onto one or more intermediate layers (not shown) interposed between the substrate layer 104 and the deposited layer 106. The multi-layered structure 102 may also include one or more conductive layers 108. The conductive layer 108 may have an electrical conductivity greater than the substrate layer 104, greater than the deposited layer 106, or preferably greater than both the substrate layer 104 and the deposited layer 106. The deposited layer 106 preferably is interposed between the substrate layer 104 and a conductive layer 108. For example, a deposited layer 106 may include a first surface at least partially in contact with the substrate layer 104, and an opposing surface at least partially in contact with a conductive layer 108. As such, the deposited layer 106 may be a barrier layer that reduces or prevents the diffusion of atoms between a conductive layer 108 and a substrate layer 102.

Test Methods

Adhesion

Adhesion is measured using an adhesion tape test according to ASTM B905-00. A rating of 5B indicates good adhesion and that the deposited layer is not removed by the tape.

Deposition Rate

Deposition rate is determined by measuring the thickness of the deposited layer (in units of nm) and dividing by the deposition time (in units of minutes).

Etch Rate

The etch rate (in units of μm/min) is measured as the rate of change in thickness of the deposited layer when immersed in a ferricyanide solution at 25° C.

Electrical Resistivity

The sheet resistance of the deposited films is measured using a four-point probe. Two samples are measured for each deposition condition. The resistivity is then calculated by the geometry of the test sample.

Microstructure of Deposited Firms.

The microstructure of the deposited films is obtainable using scanning electron microscopy. A JEOL JSM-7000F field emission electron microscope that can measure backscattered electrons and secondary electrons is used in the examples.

Microstructure of the Sputter Targets.

The microstructure of the sputter targets is obtainable using scanning electron microscopy. An ASPEX Personal Scanning Electron Micrsoscope is employed. The working distance is about 20 mm and the acceleration voltage is about 20 keV. The secondary electron detector is Everhart-Thornley type. The images are also obtained of the backscattered electrons. The electron microscope is also employed for measurement of energy dispersive x-ray spectroscopy using a spot size of about 1 μm. Samples for electron microscopy of the sputter target are prepared by sectioning with an abrasive cutoff wheel, mounting the section in a polymeric material, rough grinding with SiC papers with progressively finer grits, final polishing with a diamond paste and then with an $Al_2O_3$, $SiO_2$ suspension.

X-Ray Diffraction Measurements

X-ray diffraction studies are performed using a Phillips XPert Pro X-ray diffractometer.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes. The term "consisting essentially of" to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist essentially of or consist of the elements, ingredients, components or steps.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps.

It is understood that the above description is intended to be illustrative and not restrictive. Many embodiments as well as many applications besides the examples provided will be apparent to those of skill in the art upon reading the above description. The scope of the invention should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. The omission in the following claims of any aspect of subject matter that is disclosed herein is not a disclaimer of such subject matter, nor should it be regarded that the inventors did not consider such subject matter to be part of the disclosed inventive subject matter.

EXAMPLES

Examples 1-13—Molybdenum/Niobium/Tantalum

Example 1 illustrates a sputter target including molybdenum, niobium and tantalum. Examples 2-13 illustrate deposited films prepared from the sputter target of Example 1.

Example 1

Example 1 is a sputter target that is prepared by first blending molybdenum powder having a particle size of about 3-4 μm, tantalum powder having a particle size of about 45-90 μm, and niobium powder having a particle size of about 10-45 μm to form a powder blend having about 80 atomic % molybdenum, about 10 atomic % niobium, and about 10 atomic % tantalum. The blending is done in a V-blender for about 20 minutes to obtain a homogeneous mixture of the three different powders. The resulting powder blend is then consolidated by uniaxially pressing with an applied force of about 340,000 kg into pellets having a diameter of about 95 mm (i.e., a pressure of about 470 MPa) at a temperature of about 23° C. The pressed pellet is then encapsulated in a can made of low carbon steel and hot isostatically pressed at a temperature of about 1325° C. and a pressure of about 100 to about 120 MPa for about 4 hours. Thus prepared, Example 1 has a density which is greater than about 94% of the theoretical density. The consolidated material is then removed from the can and machined to a diameter of about 58.4 mm and a thickness of about 6.4 mm.

The target includes at least one first phase containing greater than 50 atomic % molybdenum, at least one second phase containing greater than 50 atomic % niobium, and at least one third phase containing greater than about 50 atomic % tantalum. A scanning electron micrograph of the sputter target using secondary electrons is illustrated in FIG. 1. Scanning electron micrographs of the sputter target using backscattered electrons are illustrated in FIGS. 2, 3A, 4A, 5A, 6A, and 7A. As illustrated in these figures, the sputter target may have a morphology including a continuous phase of molybdenum 16 a discrete phase of tantalum 12 (indicated by the light regions), and a discrete phase of niobium 14 (indicated by the dark regions). The sputter target is also analyzed using X-ray absorption spectroscopy for elemental analysis in different regions of the target. As illustrated in FIG. 3B, the sputter target includes a phase consisting essentially of molybdenum. As illustrated in FIG. 4B, the sputter target includes a phase that consists essentially of niobium. As illustrated in FIG. 5B, the sputter target includes a region that consists essentially of tantalum. As illustrated in FIG. 6B, the sputter target includes a region that consists essentially of an alloy of molybdenum and niobium. As illustrated in FIG. 7B, the sputter target includes a region that consists essentially of an alloy of molybdenum and tantalum.

As illustrated in FIGS. 1-7, the majority of the sputter target may be the first phase (i.e., the phase containing 50 atomic % or more molybdenum) and the first phase may be a continuous phase. Without being bound by theory, it is believed that the alloy phases (e.g., the molybdenum/niobium alloy phase and the molybdenum/tantalum alloy phase) are formed during the hot isostatic pressing step by diffusion of the metal elements (e.g., diffusion of the molybdenum atoms into niobium domains and into tantalum domains).

Examples 2-13

Examples 2-13 illustrate a method that includes steps of sputtering a thin film layer using a sputter target as taught herein onto a substrate (e.g., a silicon-containing substrate, or a glass-containing substrate). Sputtering may be performed using a magnetron. In general, sputtering will occur for about 1 to about 240 minutes (preferably about 1 to about 40 minutes), under conditions of vacuum from about 1 to about 100 mTorr pressure (preferably from about 2 to about 20 mTorr pressure), and a spacing between the substrate and the sputter target of about 5 to 300 mm (preferably about 20 to about 150 mm. The resulting structure will have characteristics consistent with examples 2-13 herein.

Examples 2-13 are prepared by placing the sputter target of Example 1 into a magnetron sputter deposition chamber using the conditions described in Tables 1A and 1B. The substrate is either a silicon wafer (100) orientation, or Corning 1737 glass. Prior to deposition, the substrate is cleaned by successive rinsing in ultrasonic baths of acetone and ethyl alcohol. The substrates are then dried by blowing nitrogen gas. The substrates are next loaded into the deposition chamber along with the sputter target. The target is sputter cleaned with an argon flow of at a pressure of about 5 mTorr at 200 W DC for about 10 minutes. During the cleaning of the target, a shutter is placed in front of the target to prevent deposition onto the substrate.

When using the glass substrate, the substrate is etched by sputtering at 60 mTorr for 30 minutes to remove possible contamination on the substrate surface.

After the sputter cleaning of the target, the shutter is removed and the target material is sputtered onto a substrate using 300 W, direct current, with the substrate at 0V, grounded. The spacing between the substrate and the target is maintained at about 121 mm. Sputtering times of about 5 minutes and about 30 minutes, and chamber pressures of about 3, about 5 and about 8 mTorr are employed as shown in Tables 1A and 1B.

TABLE 1A

Deposition conditions using the sputter target of Example 1 target on silicon substrate.

| Sputter Target | Example Number | | | | | |
|---|---|---|---|---|---|---|
| | EX. 2 EX. 1 | EX. 3 EX. 1 | EX. 4 EX. 1 | EX. 5 EX. 1 | EX. 6 EX. 1 | EX. 7 EX. 1 |
| Substrate-Si wafer 100 | yes | yes | yes | yes | yes | yes |
| Substrate-Corning 1737 glass | | | | | | |
| Chamber Pressure, mTorr | 3 | 3 | 5 | 5 | 8 | 8 |
| Deposition time, min | 5 | 30 | 5 | 30 | 5 | 30 |
| Thickness, μm | 0.2 | 1.0 | 0.2 | 1.1 | 0.2 | 1.3 |
| Etch rate, nm/min | | 447 | | 484 | | 502 |

TABLE 1B

Deposition conditions using the sputter target of Example 7A target on glass substrate.

| Sputter Target | Example Number | | | | | |
|---|---|---|---|---|---|---|
| | EX. 8 EX. 1 | EX. 9 EX. 1 | EX. 10 EX. 1 | EX. 11 EX. 1 | EX. 12 EX. 1 | EX. 13 EX. 1 |
| Substrate-Si wafer 100 | | | | | | |
| Substrate-Corning 1737 glass | yes | yes | yes | yes | yes | yes |
| Chamber Pressure, mTorr | 3 | 3 | 5 | 5 | 8 | 8 |

TABLE 1B-continued

Deposition conditions using the sputter target of Example 7A target on glass substrate.

| Sputter Target | Example Number | | | | | |
|---|---|---|---|---|---|---|
| | EX. 8 EX. 1 | EX. 9 EX. 1 | EX. 10 EX. 1 | EX. 11 EX. 1 | EX. 12 EX. 1 | EX. 13 EX. 1 |
| Deposition time, min | 5 | 30 | 5 | 30 | 5 | 30 |
| Resistivity, μΩ·cm | 18.0 | 17.3 | 19.4 | 17.9 | 20.1 | 19.5 |

Figure 8B:
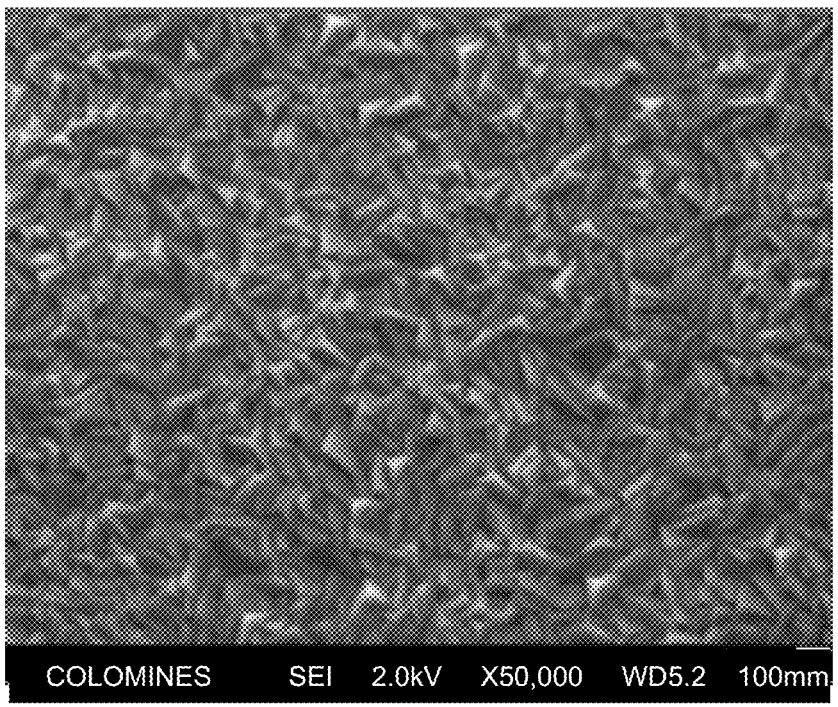

FIG. 8A is a secondary electron scanning electron micrograph at a magnification of about 50,000 that illustrates the surface of the deposited layer of Example 3 (deposited using a deposition pressure of about 3 mTorr and a deposition time of about 30 minutes). The morphology of the deposited layer consists essentially of a single alloy phase containing about 80 atomic % molybdenum, about 10 atomic % niobium and about 10 atomic % tantalum. As illustrated in FIG. 8A, the alloy of Example 3 has an average grain size of about 49 nm. FIG. 8B is a secondary electron scanning electron micrograph at a magnification of about 50,000 that illustrates the surface of the deposited layer of Example 7 (deposited using a deposition pressure of about 8 mTorr and a deposition time of about 30 minutes). The morphology of the deposited layer consists essentially of a single alloy phase containing about 80 atomic % molybdenum, about 10 atomic % niobium and about 10 atomic % tantalum. As illustrated in FIG. 8B, the alloy has an average grain size of about 62 nm.

FIG. 9 is a secondary electron scanning electron micrograph at a magnification of about 30,000 that illustrates the cross-section of the deposited layer of Example 7. The deposited layer has a columnar morphology.

In Examples 2-13, the deposited layers are deposited at a deposition rate of about 33 to about 41 nm/min. Samples prepared with a deposition time of about 5 minutes have a thickness of about 200 nm. Samples prepared with a deposition time of about 30 minutes have a thickness of about 900 to about 1300 nm. The adhesion to the glass substrate of the Example 10 prepared at a pressure of about 5 mTorr is about 4B. The adhesion to the glass substrate of the Examples 8 and 12 prepared at a pressure of 3 and 8 mTorr respectively is about 5B. The adhesion to the silicon substrate of Example 2, 4 and 6 prepared at pressure of 3, 5 and 8 mTorr respectively is about 5B.

The electrical resistivity of the deposited layers is given in Table 1B for Examples 8-13. The average electrical resistivity of the deposited layer on the glass substrate is about 19.2 μΩ·cm for the layers having a thickness from about 100 to about 200 nm and about 18.2 μΩ·cm for the samples having a thickness greater than about 0.9 μm. The uniformity of the electrical resistivity is measured on Example 4, by measuring the electrical resistivity at multiple locations on the 3" wafer. The uniformity of the electrical resistivity is the ratio of the standard deviation of the electrical resistivity to the average electrical resistivity. The uniformity of the electrical resistivity of Example 4 is about 0.07.

The etch rate of the deposited layers in ferricyanide solution for Examples 3, 5, and 7 are measured at 25° C. The etch rates are determined by dividing the change in thickness by the etching time. The etch rates, in units of nm/min are given in Table 1A. The average etch rate for the films prepared with the Example 1 sputter target is about 478 nm/min.

Example 14

Figure 10C:
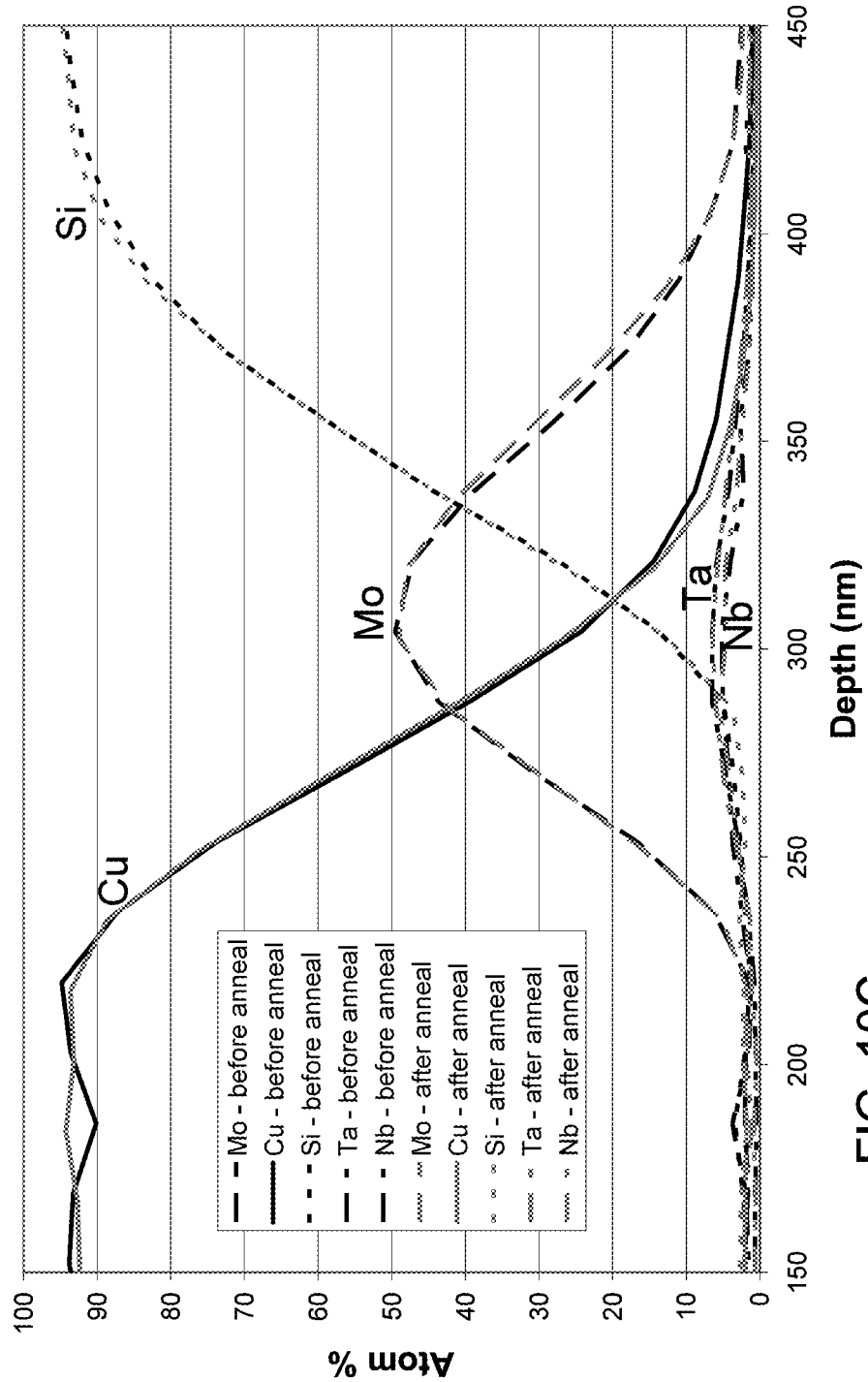

Example 14 is prepared by depositing a 35 nm molybdenum containing layer from the Example 1 sputter target onto a silicon substrate followed by the depositing of a copper (Cu) layer having a thickness of about 300 nm onto the molybdenum containing layer. The composition depth profile of the multilayered material is measured using Auger depth profile analysis. The sample is then annealed for 30 minutes at 350° C. and the Auger depth profile analysis is repeated. FIG. 10A illustrates the Auger depth profile for copper (Cu), molybdenum (Mo), niobium (Nb), tantalum (Ta), oxygen (O), and silicon (Si) before annealing. FIG. 10B illustrates the Auger depth profile after annealing. FIG. 10C illustrates the Auger depth profile for Cu, Mo, Nb, Ta, O and Si, before and after the annealing near the interfaces between the molybdenum containing layer and both the silicon substrate and the copper layer. As seen in FIGS. 10A, 10B and 10C, the composition profiles for Cu, Mo, Nb, Ta, O, and Si, are about the same before and after the annealing step. The molybdenum containing layer acts as a barrier to reduce and/or prevent the migration of Cu into the Si substrate and Si into the Cu layer. X-ray analysis of the sample after annealing shows that there is no detectable copper silicide. This illustrates the ability of the Mo—Nb—Ta deposited film from the Example 1 sputter target to prevent the formation of copper silicide after annealing for 30 minutes at 350° C. The electrical resistivity of the copper layer is about 1.7 μΩ·cm before annealing and about 1.7 μΩ·cm after annealing. The generally constant electrical resistivity of the copper layer further indicates that the molybdenum containing layer is preventing the formation of copper silicide.

Examples 15-16—Molybdenum (50%) and Titanium (50%)

Example 15

Comparative Example 15 is a sputter target including about 50 atomic % molybdenum and about 50 atomic % titanium. The sputter target is prepared using the method described for Example 1, except only titanium and molybdenum particles are used at an atomic ratio of 50:50 of Mo:Ti, the target is hot isostatically pressed at a temperature of about 1325° C. and a pressure of about 100 to about 120 MPa for about 4 hours.

Example 16

Example 16 is a 200 nm thick film deposited on a glass substrate using the method of Example 10, except the sputter target of Example 15 is used. The deposition rate is about 102.6 nm/min. The electrical resistivity of the 200 nm thick film is about 79.8 μΩ·cm. The adhesion of the deposited layer to glass is about 5B. The etch rate of the deposited layer is about 77 nm/min. The deposited layer has a columnar morphology.

Examples 17-25—Molybdenum/Titanium/Tantalum

Example 17 illustrates a sputter target including molybdenum, titanium, and tantalum, and Examples 18-25 illustrate deposited films prepared from the sputter target.

Example 17 is a sputter target that is prepared by first blending molybdenum powder having a particle size of about 3-4 μm, titanium powder having a particle size of about 10-45 μm, and tantalum powder having a particle size of about 45-90 μm to form a powder blend having about 80 atomic % molybdenum, about 10 atomic % titanium, and about 10 atomic % tantalum. The blending is done in a V-blender for about 20 minutes to obtain a homogeneous mixture of the three different powders. The resulting powder blend is then consolidated by uniaxially pressing with an applied force of about 340,000 kg into pellets having a diameter of about 95 mm (i.e., a pressure of about 470 MPa) at a temperature of about 23° C. The pressed pellet is then encapsulated in a can made of low carbon steel and hot isostatically pressed at a temperature of about 1325° C. and a pressure of about 100 to about 120 MPa for about 4 hours. Thus prepared, Example 17 has a density which is greater than about 94% of the theoretical density. The consolidated material is then removed from the can and machined to a diameter of about 58.4 mm and a thickness of about 6.4 mm.

Examples 18-25 are prepared by placing the sputter target of Example 17 into a magnetron sputter deposition chamber using the conditions described in Table 2. The substrate is either a silicon wafer (100) orientation, or Corning 1737 glass. Prior to deposition, the substrate is cleaned by successive rinsing in ultrasonic baths of acetone and ethyl alcohol. The substrates are then dried by blowing nitrogen gas. The substrates are next loaded into the deposition chamber along with the sputter target. The target is sputter cleaned with an argon flow of at a pressure of about 5 mTorr at 200 W DC for about 10 minutes. During the cleaning of the target, a shutter is placed in front of the target to prevent deposition onto the substrate.

When using the glass substrate, the substrate is etched by sputtering at 60 mTorr for 30 minutes to remove possible contamination on the substrate surface.

After the sputter cleaning of the target, the shutter is removed and the target material is sputtered onto the substrate using 200 W, direct current, with the substrate at 0V, grounded. The spacing between the substrate and the target is maintained at about 76 mm. Sputtering times of 3 minutes and 30 minutes, and chamber pressures of 5 and 8 mTorr are employed as shown in Table 2.

TABLE 2

| | Deposition Conditions for Mo—Ti—Ta sputter targets | | | | | | | |
|---|---|---|---|---|---|---|---|---|
| | Example Number | | | | | | | |
| Sputter Target | EX. 18 EX. 17 | EX. 19 EX. 17 | EX. 20 EX. 17 | EX. 21 EX. 17 | EX. 22 EX. 17 | EX. 23 EX. 17 | EX. 24 EX. 17 | EX. 25 EX. 17 |
| Substrate-Si wafer 100 | yes | yes | yes | yes | | | | |
| Substrate-Corning 1737 glass | | | | | yes | yes | yes | yes |
| Chamber Pressure, mTorr | 5 | 5 | 8 | 8 | 5 | 5 | 8 | 8 |
| Deposition time, min | 3 | 30 | 3 | 30 | 3 | 30 | 3 | 30 |

The deposition rate of the Example 17 target onto the substrates is about 62.4 nm/hr using the conditions of Examples 18-25. The deposited films contain about 80 atomic % molybdenum, about 10 atomic % titanium and about 10 atomic % tantalum.

The average grain size of the deposited layer of Examples 23 and 25 are measured using secondary electron scanning electron micrograph at a magnification of about 50,000 of the surface of the deposited layer. The average grain size of Examples 20 and 21 are 125 nm and 89 nm respectively.

The thin films (having a thickness of about 200 nm and prepared with a deposition time of about 5 minutes) deposited by the Example 17 sputter target have an electrical resistivity of about 26.5 µΩ·cm and the thick films (having a thickness greater than about 1 µm and prepared with a deposition time of about 30 minutes) have an electrical resistivity of about 22.6 µΩ·cm.

When etched in ferricyanide solution at about 25° C., the deposited films form Example 17 have an average etch rate of about 61 nm/min. The adhesion of the deposited film to the glass substrate varied from about 2B to about 5B, and the adhesion of the deposited film to the silicon substrate is about 5B.

Example 26—Molybdenum/Niobium/Titanium

The sputter target of Example 26 is prepared using the method of Example 1 except the tantalum powder is replaced with titanium powder having a particle size of about 10-45 µm. Deposited films are then prepared using the methods of Examples 2-13, except the sputter target including molybdenum, niobium, and titanium is employed. The deposited films have an etch rate of about 497 nm/min. The deposited films have an adhesion to glass of about 5B. The deposited films have an adhesion to silicon of about 5B. The deposited films have a grain size of about 51-98 nm. The deposited films have an electrical conductivity of about 30.9 µΩ·cm (for 200 nm thick films) and about 20.0 µΩ·cm (for 1 µm thick films).

Example 27—Molybdenum/Vanadium/Titanium

The sputter target of Example 27 is prepared using the method of Example 1 except the tantalum powder is replaced with titanium powder having a particle size of about 10-45 µm and niobium powder is replaced with vanadium powder having a particle size of about 10-45 µm. Deposited films are then prepared using the methods of Examples 2-13, except the sputter target including molybdenum, vanadium, and titanium is employed. The deposited films have an etch rate of about 270 nm/min. The deposited films have an adhesion to glass of about 5B. The deposited films have an adhesion to silicon of about 5B. The deposited films have a grain size of about 49-72 nm. The deposited films have an electrical conductivity of about 32.5 µΩ·cm (for 200 nm thick films) and about 28.5 µΩ·cm (for 1 µm thick films).

Example 28—Molybdenum/Vanadium/Tantalum

The sputter target of Example 28 is prepared using the method of Example 1 except the niobium powder is replaced with vanadium powder having a particle size of about 10-45 µm. Deposited films are then prepared using the methods of Examples 2-13, except the sputter target including molybdenum, vanadium, and tantalum is employed. The deposited films have an etch rate of about 349 nm/min. The deposited films have an adhesion to glass of about 5B. The deposited films have an adhesion to silicon of about 0B to about 5B. The deposited films have a grain size of about 46-75 nm. The deposited films have an electrical conductivity of about 22.8 µΩ·cm (for 200 nm thick films) and about 17.5 µΩ·cm (for 1 µm thick films).

Example 29—Molybdenum/Vanadium/Niobium

The sputter target of Example 29 is prepared using the method of Example 1 except the tantalum powder is replaced with vanadium powder having a particle size of about 10-45 µm. Deposited films are then prepared using the methods of Examples 2-13, except the sputter target including molybdenum, niobium, and vanadium, is employed. The deposited films have an etch rate of about 243 nm/min. The deposited films have an adhesion to glass of about 1B to about 5B. The deposited films have an adhesion to silicon of about 1B to about 5B. The deposited films have a grain size of about 50-89 nm. The deposited films have an electrical conductivity of about 35.2 µΩ·cm (for 200 nm thick films) and about 33.2 µΩ·cm (for 1 µm thick films).

Example 30—Molybdenum/Niobium/Chromium

The sputter target of Example 29 is prepared using the method of Example 1 except the titanium powder is replaced with chromium powder having a particle size of about 10-45 µm. Deposited films are then prepared using the methods of Examples 2-13, except the sputter target including molybdenum, niobium, and chromium, is employed. The deposited films have an etch rate of about 441 nm/min. The deposited films have an adhesion to glass of about 3B to about 5B. The deposited films have an adhesion to silicon of about 4B to about 5B. The deposited films have a grain size of about 45-63 nm. The deposited films have an electrical conductivity of about 27.9 µΩ·cm (for 200 nm thick films) and about 21.4 µΩ·cm (for 1 µm thick films).

What is claimed is:

1. A sputter target that is sputterable to form a film comprising an alloy containing molybdenum, a second metal element, and a third metal element, the sputter target comprising:
    40 atomic % or more molybdenum, based on the total number of atoms in the sputter target;
    0.1 atomic % or more of a second metal element, based on the total number of atoms in the sputter target, wherein the second metal element is niobium; and
    at least 5 atomic % of a third metal element, based on the total number of atoms in the sputter target, wherein the third metal element is selected from the group consisting of zirconium, hafnium, and chromium,
    wherein a total concentration of molybdenum, the second metal element, and the third metal element in the sputter target is 95 atomic percent or more, based on the total number of atoms in the sputter target.

2. The sputter target of claim 1, wherein the sputter target contains less than 85 atomic % molybdenum.

3. The sputter target of claim 1, wherein the sputter target contains at least 2 atomic % of the second metal element.

4. The sputter target of claim 1, wherein the sputter target contains at least 5 atomic % of the second metal element.

5. The sputter target of claim 1, wherein (i) the sputter target contains 0.1 atomic % or more of a fourth metal element, based on the total number of atoms in the sputter target, (ii) the fourth metal element is selected from the group consisting of vanadium, tantalum, tungsten, zirconium, hafnium, chromium, and titanium, and (iii) the fourth metal element is different from the second metal element and different from the third metal element.

6. The sputter target of claim 5, wherein (i) the sputter target contains 0.1 atomic % or more of a fifth metal element, based on the total number of atoms in the sputter target, (ii) the fifth metal element is selected from the group consisting of vanadium, tantalum, tungsten, zirconium, hafnium, chromium, and titanium, and (iii) the fifth metal element is different from the second metal element, different from the third metal element, and different from the fourth metal element.

7. The sputter target of claim 1, wherein the third metal element is zirconium.

8. The sputter target of claim 1, wherein the third metal element is hafnium.

9. The sputter target of claim 1, wherein the third metal element is chromium.

10. The sputter target of claim 1, wherein the sputter target contains at least 0.5 atomic % of the second metal element.

11. The sputter target of claim 1, wherein the sputter target contains at least 1 atomic % of the second metal element.

12. The sputter target of claim 1, wherein the total concentration of molybdenum, the second metal element, and the third metal element in the sputter target is 99 atomic percent or more, based on the total number of atoms in the sputter target.

13. The sputter target of claim 1, wherein the total concentration of molybdenum, the second metal element, and the third metal element in the sputter target is 99.5 atomic percent or more, based on the total number of atoms in the sputter target.

14. A sputter target that is sputterable to form a film comprising an alloy containing molybdenum, a second metal element, and a third metal element, the sputter target comprising:
    less than 85 atomic % molybdenum, based on the total number of atoms in the sputter target;
    0.1 atomic % or more of a second metal element, based on the total number of atoms in the sputter target, wherein the second metal element is selected from the group consisting of niobium, tantalum, tungsten, zirconium, and hafnium; and
    2 atomic % or more of a third metal element, based on the total number of atoms in the sputter target, wherein (i) the third metal element is selected from the group consisting of tantalum, tungsten, and hafnium, and (ii) the third metal element is different from the second metal element,
    wherein a total concentration of molybdenum, the second metal element, and the third metal element in the sputter target is 95 atomic percent or more, based on the total number of atoms in the sputter target.

15. The sputter target of claim 14, wherein the sputter target contains at least 1 atomic % of the second metal element.

16. The sputter target of claim 14, wherein the sputter target contains at least 2 atomic % of the second metal element.

17. The sputter target of claim 14, wherein the sputter target contains at least 5 atomic % of the second metal element.

18. The sputter target of claim 14, wherein the sputter target contains at least 5 atomic % of the third metal element.

19. The sputter target of claim 14, wherein (i) the sputter target contains 0.1 atomic % or more of a fourth metal element, based on the total number of atoms in the sputter target, (ii) the fourth metal element is selected from the group consisting of niobium, tantalum, tungsten, zirconium, and hafnium, and (iii) the fourth metal element is different from the second metal element and different from the third metal element.

20. The sputter target of claim 19, wherein (i) the sputter target contains 0.1 atomic % or more of a fifth metal element, based on the total number of atoms in the sputter target, (ii) the fifth metal element is selected from the group consisting of niobium, tantalum, tungsten, zirconium, and hafnium, and (iii) the fifth metal element is different from the second metal element, different from the third metal element, and different from the fourth metal element.

21. The sputter target of claim 14, wherein the sputter target contains 83 atomic % or less molybdenum.

22. The sputter target of claim 14, wherein the sputter target contains 81 atomic % or less molybdenum.

23. The sputter target of claim 14, wherein the total concentration of molybdenum, the second metal element, and the third metal element in the sputter target is 99 atomic percent or more, based on the total number of atoms in the sputter target.

24. The sputter target of claim 14, wherein the total concentration of molybdenum, the second metal element, and the third metal element in the sputter target is 99.5 atomic percent or more, based on the total number of atoms in the sputter target.

* * * * *